US011696432B2

United States Patent
Lee et al.

(10) Patent No.: US 11,696,432 B2
(45) Date of Patent: Jul. 4, 2023

(54) MULTI-DIRECTION CONDUCTIVE LINE AND STAIRCASE CONTACT FOR SEMICONDUCTOR DEVICES

(71) Applicant: Micron Technology, Inc., Boise, ID (US)

(72) Inventors: Si-Woo Lee, Boise, ID (US); Byung Yoon Kim, Boise, ID (US); Kyuseok Lee, Boise, ID (US); Sangmin Hwang, Boise, ID (US); Mark Zaleski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 175 days.

(21) Appl. No.: 17/060,356

(22) Filed: Oct. 1, 2020

(65) Prior Publication Data

US 2022/0108987 A1    Apr. 7, 2022

(51) Int. Cl.
| | | |
|---|---|---|
| H01L 27/108 | (2006.01) | |
| H10B 12/00 | (2023.01) | |
| G11C 5/02 | (2006.01) | |
| G11C 5/10 | (2006.01) | |
| H01L 27/06 | (2006.01) | |

(52) U.S. Cl.
CPC ............ H10B 12/30 (2023.02); G11C 5/025 (2013.01); G11C 5/10 (2013.01); H01L 27/0688 (2013.01)

(58) Field of Classification Search
CPC ........... H01L 27/10805; H01L 27/0688; G11C 5/025; G11C 5/10
See application file for complete search history.

(56) References Cited

U.S. PATENT DOCUMENTS

| | | | |
|---|---|---|---|
| 5,866,928 A | * | 2/1999 | Siek .................... G11C 11/4091 365/72 |
| 10,147,638 B1 | | 12/2018 | Williamson et al. |
| 10,607,995 B2 | | 3/2020 | Roberts et al. |
| 11,069,706 B2 | | 7/2021 | Lee et al. |
| 2010/0155810 A1 | | 6/2010 | Kim et al. |
| 2014/0008806 A1 | | 1/2014 | Ha et al. |
| 2014/0241026 A1 | | 8/2014 | Tanzawa |
| 2017/0033042 A1 | | 2/2017 | Pellizzer et al. |
| 2017/0148748 A1 | | 5/2017 | Jeong et al. |
| 2018/0323200 A1 | | 11/2018 | Tang et al. |

(Continued)

FOREIGN PATENT DOCUMENTS

KR    10-2020-0072638 A    6/2020

OTHER PUBLICATIONS

U.S. Appl. No. 16/204,224, entitled, "Memory Arrays," filed Nov. 29, 2018, 43 pages.

(Continued)

*Primary Examiner* — Walter H Swanson
(74) *Attorney, Agent, or Firm* — Brooks, Cameron & Huebsch, PLLC

(57) ABSTRACT

Systems, methods, and apparatus including multi-direction conductive lines and staircase contacts for semiconductor devices. One memory device includes an array of vertically stacked memory cells, the array including: a vertical stack of horizontally oriented conductive lines, each conductive line comprising: a first portion extending in a first horizontal direction; and a second portion extending in a second horizontal direction at an angle to the first horizontal direction.

7 Claims, 28 Drawing Sheets

(56) References Cited

U.S. PATENT DOCUMENTS

2019/0103406 A1    4/2019  Tang et al.
2019/0164985 A1    5/2019  Lee et al.
2019/0189635 A1*   6/2019  Lilak .................. H01L 23/5283

OTHER PUBLICATIONS

International Search Report and Written Opinion from related international patent application No. PCT/US2021/042511, dated Nov. 10, 2021, 11 pages.

* cited by examiner

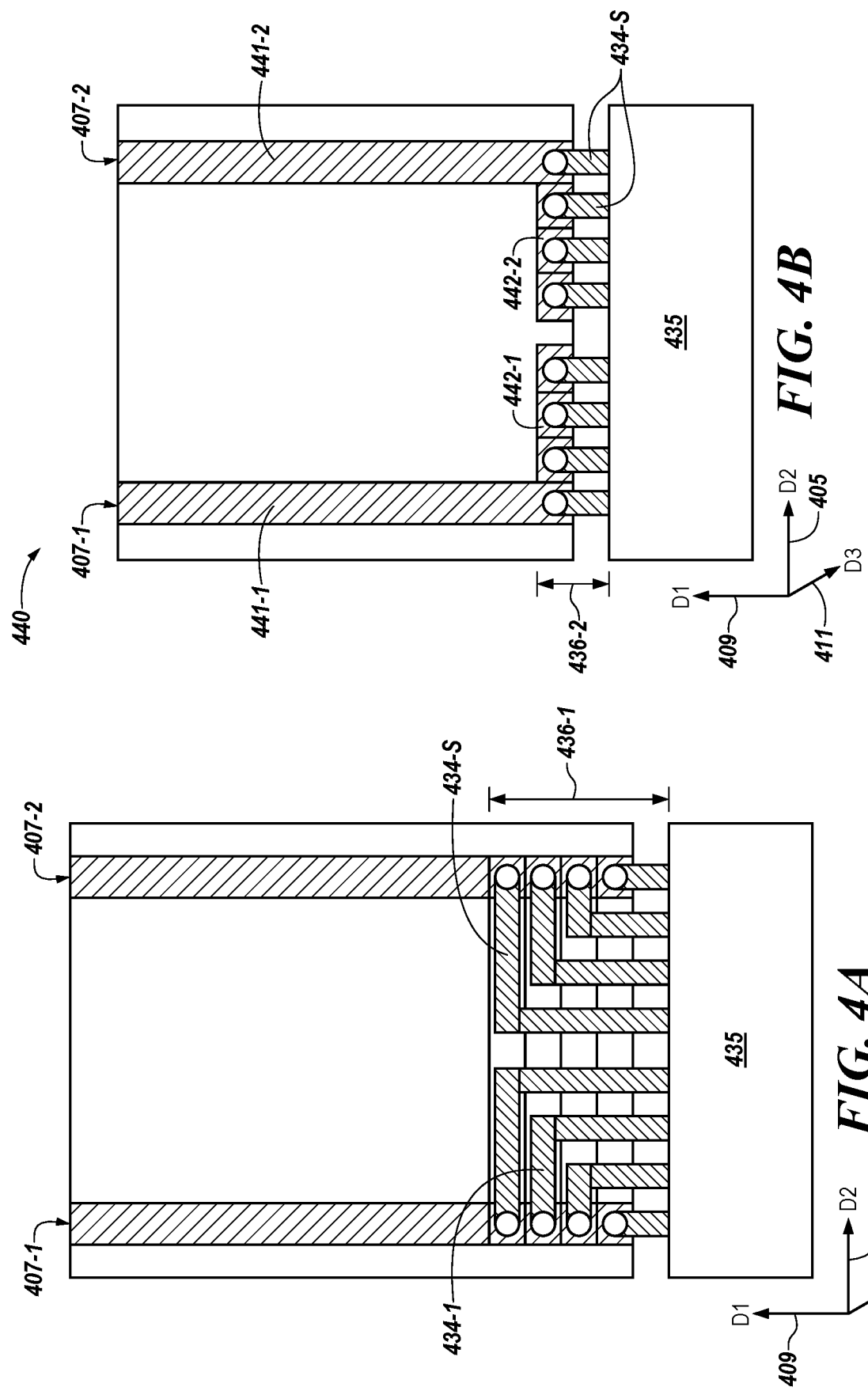

MULTI-DIRECTION CONDUCTIVE LINE AND STAIRCASE CONTACT FOR SEMICONDUCTOR DEVICES

TECHNICAL FIELD

The present disclosure relates generally to memory devices, and more particularly, to a multi-direction conductive line and staircase conductive line contact structures for semiconductor devices.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, (e.g., a transistor), having a first and a second source/drain regions separated by a channel region. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a conductive line, such as a digit line. The access device can be activated (e.g., to select the cell) by an access line coupled to an access transistor. The capacitor can store a charge corresponding to a data value of a respective cell (e.g., a logic "1" or "0").

BRIEF DESCRIPTION OF THE DRAWINGS

FIG. 4A is an overhead view illustrating a conventional memory device configuration.

FIG. 4B is an overhead view illustrating a memory device configuration in accordance with a number of embodiments of the present disclosure.

DETAILED DESCRIPTION

Figure 1:
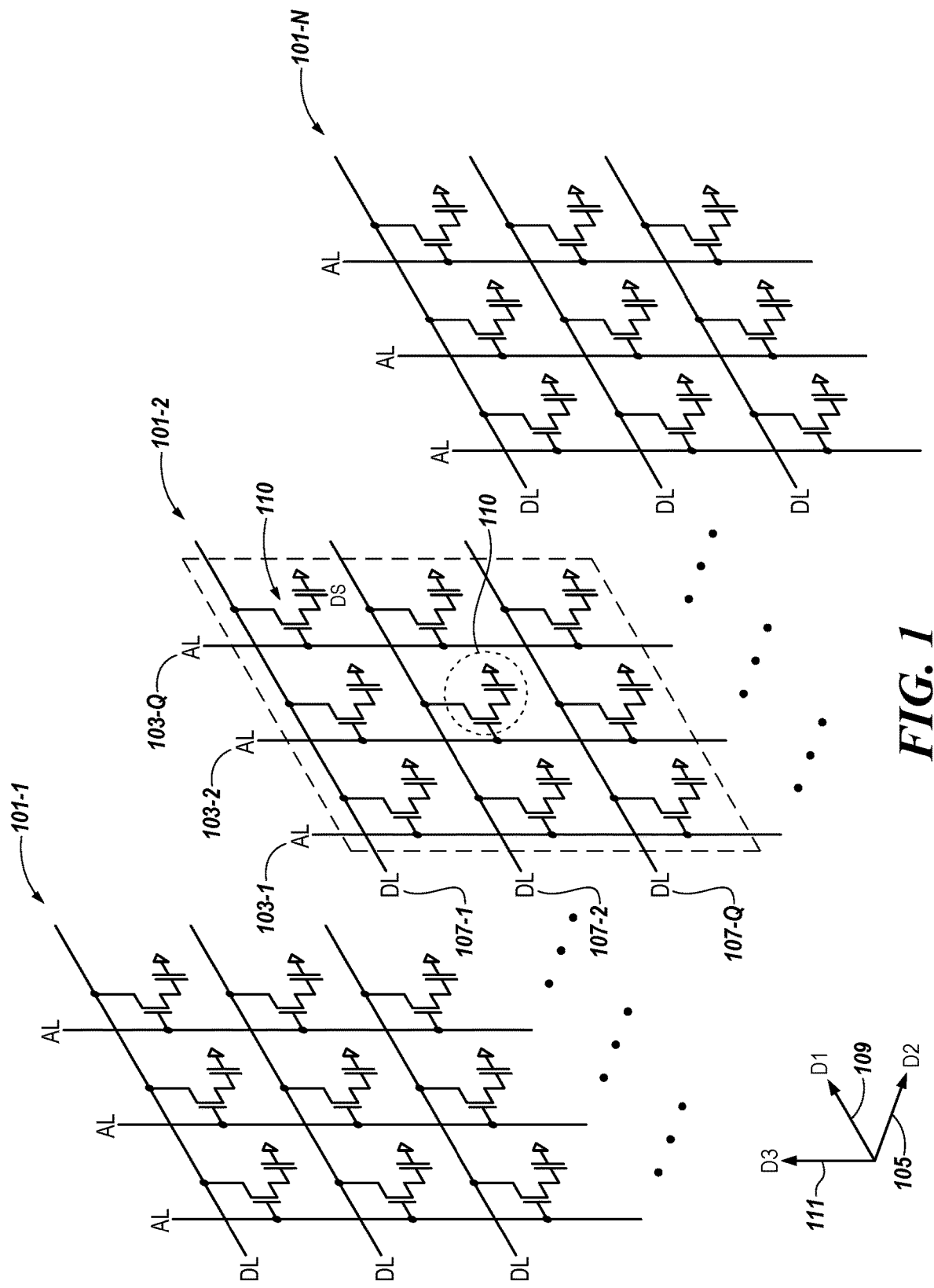
FIG. 1. is a schematic illustration of a vertical three dimensional (3D) memory device in accordance with a number of embodiments of the present disclosure.

Embodiments of the present disclosure describe a multi-direction conductive lines and staircase contacts for semiconductor devices. The multi-direction conductive lines and staircase contacts may be formed with horizontal access devices in an array of vertically stacked memory cells.

The horizontal access devices may be integrated with vertically oriented access lines and with horizontal digit lines. Although discussed herein as having vertically oriented access lines (e.g., word lines) and with horizontal digit lines, some embodiments may have vertically oriented digit lines and horizontal access lines with the access device being, for example, a word line driver, or other suitable access device. An advantage of the embodiments described herein is reduced spatial constraints as compared to conventional structures and processes, among other advantages.

In this manner, stacked memory devices, such as 3D DRAM devices, comprise multiple tiers of vertically stacked memory cells. Coupling the conductive lines (e.g., digit lines, word lines) of the 3D array to sense amplifiers or word line drivers can be challenging and can result in increased interconnection area size. For example, the traditional geometry of the conductive lines can result in a relatively large interconnection area associated with contacts used to connect the digit lines to the sense amplifiers. Various embodiments of the present disclosure can provide multi-direction conductive lines and can allow connection to those conductive lines through a tiered (e.g., staircase) structure. In some embodiments, the conductive lines may be digit lines coupled to one or more circuitry components (e.g., sense amplifiers) through an interconnection and/or sense amplifier contact. In other embodiments, the conductive lines may be access lines (i.e., word lines) coupled to one or more circuitry components (e.g. word line drivers). Embodiments of the present disclosure can provide benefits such as a reduced contact area (e.g., between the array and sense amplifiers) as compared to prior approaches.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302. The use of a letter, such as 302-N, is used to illustrate that in an embodiment shown in a particular figure, any number of items 302 may be utilized.

FIG. 1 is a block diagram of an apparatus in accordance with a number of embodiments of the present disclosure. FIG. 1 illustrates a circuit diagram showing a cell array of a three dimensional (3D) semiconductor memory device according to embodiments of the present disclosure. FIG. 1 illustrates that a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays (e.g., sub cell array 101-2) may include a plurality of access lines 103-1, 103-2, . . . , 103-Q (which also may be referred to as word lines). Also, each of the sub cell arrays (e.g., sub cell array 101-2) may include a plurality of digit lines 107-1, 107-2, . . . , 107-Q (which also may be referred to as bitlines, data lines, or sense lines). In FIG. 1, the digit lines 107-1, 107-2, . . . , 107-Q are illustrated extending in a first direction (D1) 109 and the access lines 103-1, 103-2, . . . , 103-Q are illustrated extending in a third direction (D3) 111.

The first direction (D1) 109 and the second direction (D2) 105 may be considered in a horizontal ("X-Y") plane. The third direction (D3) 111 may be considered in a vertical ("Z") direction (e.g., transverse to the X-Y plane). Hence, according to embodiments described herein, the access lines 103-1, 103-2, . . . , 103-Q are extending in a vertical direction (e.g., third direction (D3) 111).

A memory cell (e.g., 110) may include an access device (e.g., access transistor) and a storage node located at an intersection of each access line 103-1, 103-2, . . . , 103-Q and each digit line 107-1, 107-2, . . . , 107-Q. Memory cells may be written to, or read from, using the access lines 103-1, 103-2, . . . , 103-Q and digit lines 107-1, 107-2, . . . , 107-Q. The digit lines 107-1, 107-2, . . . , 107-Q may conductively interconnect memory cells along horizontal columns of each sub cell array 101-, 101-2, . . . , 101-N, and the access lines 103-1, 103-2, . . . , 103-Q may conductively interconnect memory cells along vertical rows of each sub cell array 101-1, 101-2, . . . , 101-N. One memory cell, e.g., 110, may be located between one access line (e.g., 103-2) and one digit line (e.g., 107-2). Each memory cell may be uniquely addressed through a combination of an access line 103-1, 103-2, . . . , 103-Q and a digit line 107-1, 107-2, . . . , 107-Q.

The digit lines 107-1, 107-2, . . . , 107-Q may be or include conducting patterns (e.g., metal lines) disposed on and spaced apart from a substrate. The digit lines 107-1, 107-2, . . . , 107-Q may extend in a first direction (D1) 109. The digit lines 107-1, 107-2, . . . , 107-Q in one sub cell array (e.g., 101-2) may be spaced apart from each other in a vertical direction (e.g., in a third direction (D3) 111).

The access lines 103-1, 103-2, . . . , 103-Q may be or include conductive patterns (e.g., metal lines) extending in a vertical direction with respect to the substrate (e.g., in a third direction (D3) 111). The access lines in one sub cell array (e.g., 101-2) may be spaced apart from each other in the first direction (D1) 109.

A gate of a memory cell (e.g., memory cell 110) may be connected to an access line (e.g., 103-2) and a first conductive node (e.g., first source/drain region) of an access device (e.g., transistor) of the memory cell 110 may be connected to a digit line (e.g., 107-2). Each of the memory cells (e.g., memory cell 110) may be connected to a storage node (e.g., capacitor). A second conductive node (e.g., second source/drain region) of the access device (e.g., transistor) of the memory cell 110 may be connected to the storage node (e.g., capacitor). Storage nodes, such as capacitors, can be formed from ferroelectric and/or dielectric materials such as zirconium oxide (ZrO2), hafnium oxide (HfO2) oxide, lanthanum oxide (La2O3), lead zirconate titanate (PZT, Pb[Zr(x)Ti(1−x)]O3), barium titanate (BaTiO3), aluminum oxide (e.g., Al2O3), a combination of these with or without dopants, or other suitable materials.

While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line (e.g., 107-2) and the other may be connected to a storage node.

Figure 2:
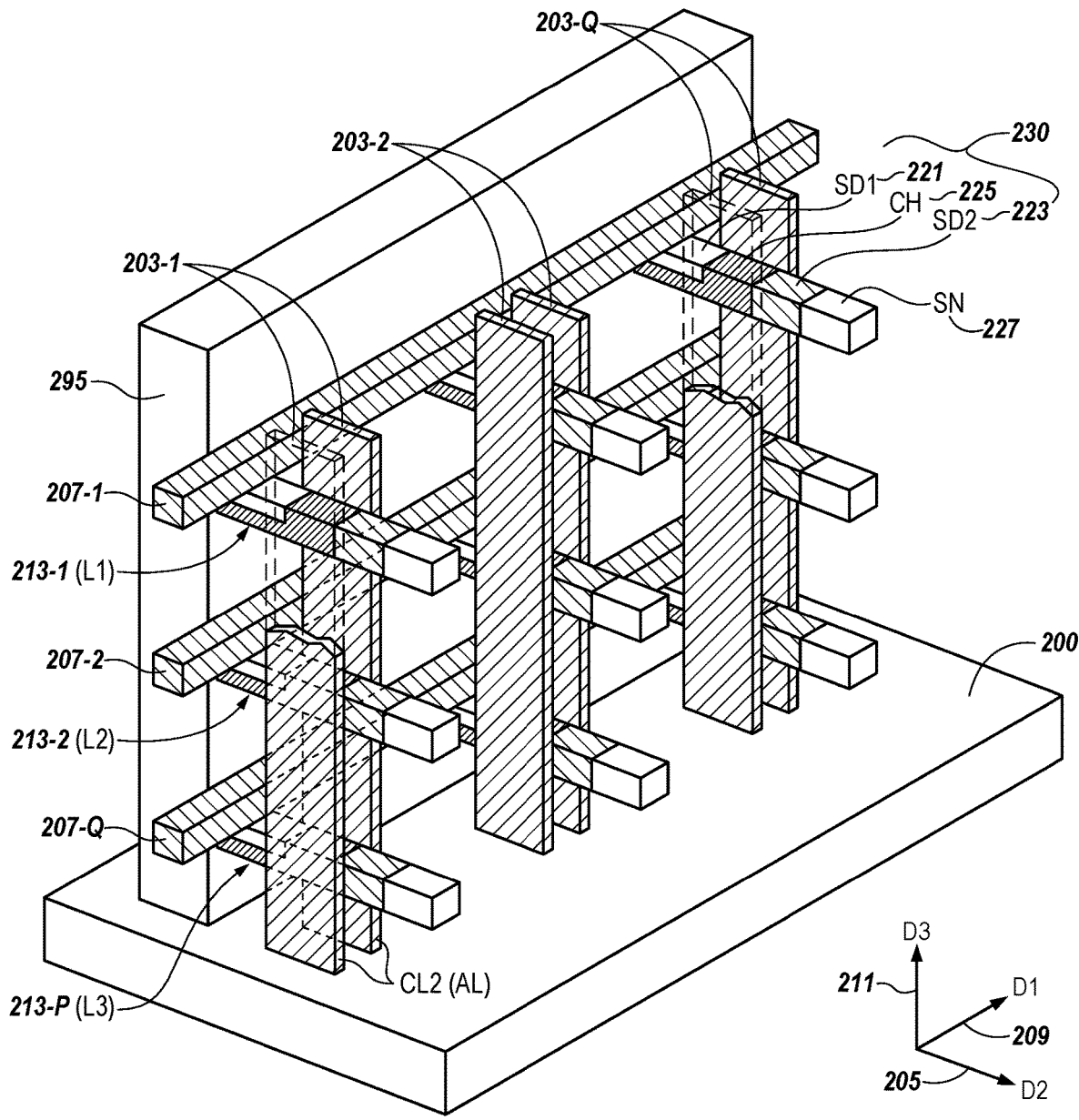
FIG. 2 is a perspective view illustrating a portion of a conductive line and staircase contact for semiconductor devices in accordance with a number of embodiments of the present disclosure.
Figure 3:
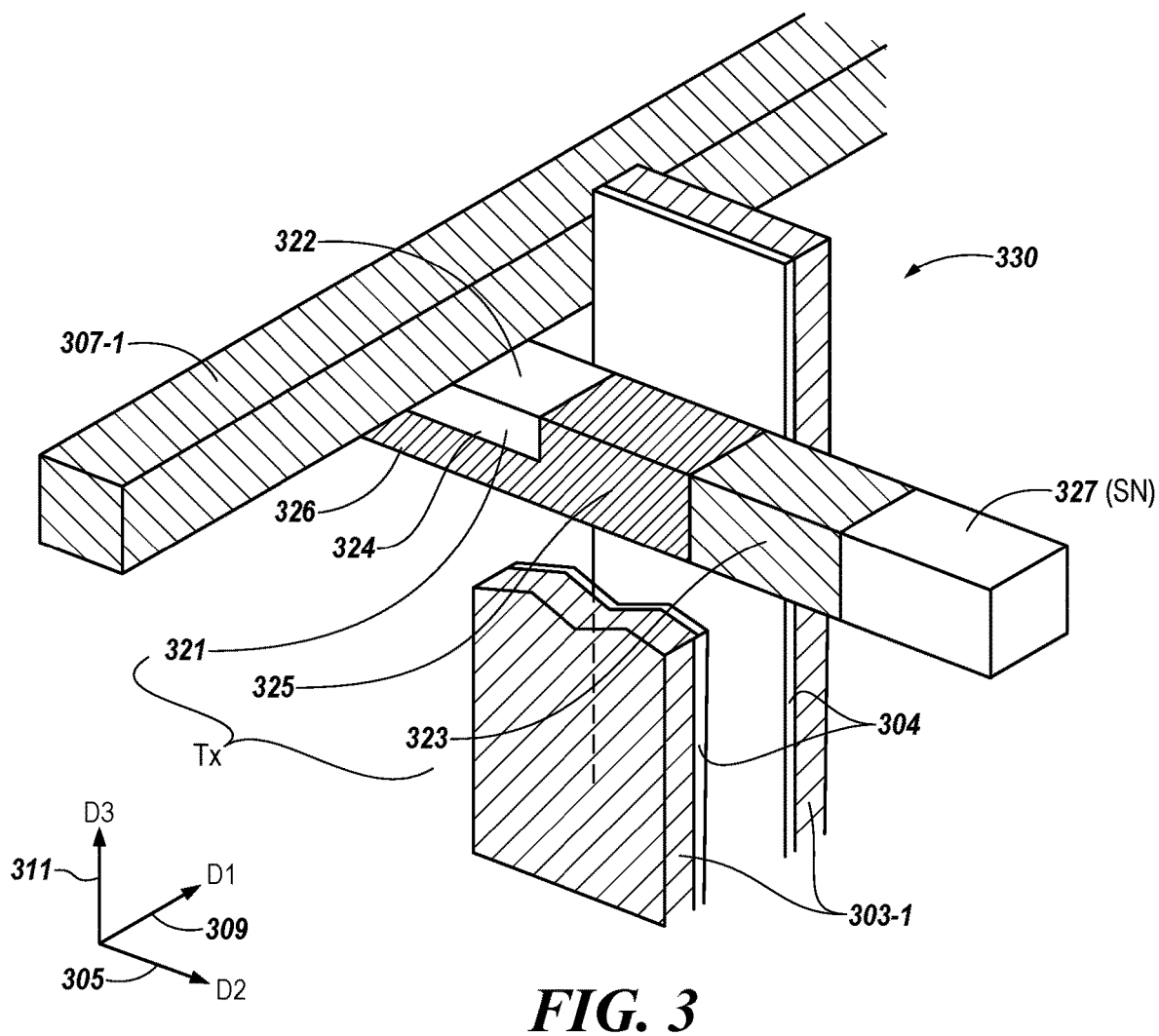
FIG. 3 is a perspective view illustrating a portion of a conductive line and staircase contact for semiconductor devices in accordance with a number of embodiments of the present disclosure.

FIG. 2 illustrates a perspective view showing a 3D semiconductor memory device (e.g., a portion of a sub cell array 101-2 shown in FIG. 1 as a vertically oriented stack of memory cells in an array) according to some embodiments of the present disclosure. FIG. 3 illustrates a perspective view showing unit cell (e.g., memory cell 110 shown in FIG. 1) of the 3D semiconductor memory device shown in FIG. 2.

As shown in FIG. 2, a substrate 200 may have formed thereon one of the plurality of sub cell arrays (e.g., 101-2) described in connection with FIG. 1. For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertically oriented stack of memory cells (e.g., memory cell 110 in FIG. 1) extending in a vertical direction (e.g., third direction (D3) 111). According to some embodiments the vertically oriented stack of memory cells may be fabricated such that each memory cell (e.g., memory cell 110 in FIG. 1) is formed on plurality of vertical levels (e.g., a first level (L1), a second level (L2), and a third level (L3)). The repeating, vertical levels, L1, L2, and L3, may be arranged (e.g., "stacked") a vertical direction (e.g., third direction (D3) 111 shown in FIG. 1) and may be separated from the substrate 200 by an insulator material 220. Each of the repeating, vertical levels, L1, L2, and L3 may include a plurality of discrete components (e.g., regions) to the laterally oriented access devices 230 (e.g., transistors) and storage nodes (e.g., capacitors) including access line 103-1, 103-2, . . . , 103-Q connections and digit line 107-1, 107-2, . . . , 107-Q connections. The plurality of discrete components to the laterally oriented access devices 230 (e.g., transistors) may be formed in a plurality of iterations of vertically, repeating layers within each level, as described in more detail below in connection with FIGS. 4A-4K, and may extend horizontally in the second direction (D2) 205, analogous to second direction (D2) 105 shown in FIG. 1.

The plurality of discrete components to the laterally oriented access devices 230 (e.g., transistors) may include a first source/drain region 221 and a second source/drain region 223 separated by a channel region 225, extending laterally in the second direction (D2) 205, and formed in a body of the access devices. In some embodiments, the channel region 225 may include silicon, germanium, silicon-germanium, and/or indium gallium zinc oxide (IGZO). In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 227 (e.g., capacitor) may be connected to one respective end of the access device. As shown in FIG. 2, the storage node 227 (e.g., capacitor) may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell (e.g., memory cell 110 in FIG. 1) may similarly extend in the second direction (D2) 205, analogous to second direction (D2) 105 shown in FIG. 1.

As shown in FIG. 2 a plurality of horizontally oriented digit lines 207-1, 207-2, . . . , 207-Q extend in the first direction (D1) 209, analogous to the first direction (D1) 109 in FIG. 1. The plurality of horizontally oriented digit lines 207-1, 207-2, . . . , 207-Q may be analogous to the digit lines 107-1, 107-2, . . . , 107-Q shown in FIG. 1. The plurality of horizontally oriented digit lines 207-1, 207-2, . . . , 207-Q may be arranged (e.g., "stacked") along the third direction (D3) 211. The plurality of horizontally oriented digit lines 207-1, 207-2, . . . , 207-Q may include a conductive material. For example, the conductive material may include one or more of a doped semiconductor (e.g., doped silicon, doped germanium, etc.) a conductive metal nitride (e.g., titanium nitride, tantalum nitride, etc.) a metal (e.g., tungsten (W), titanium (Ti), tantalum (Ta), ruthenium (Ru), cobalt (Co), molybdenum (Mo), etc.) and/or a metal-semiconductor compound (e.g., tungsten silicide, cobalt silicide, titanium silicide, etc.) Embodiments, however, are not limited to these examples.

Among each of the vertical levels, (L1) 213-1, (L2) 213-2, and (L3) 213-P, the horizontally oriented memory cells (e.g., memory cell 110 in FIG. 1) may be spaced apart from one another horizontally in the first direction (D1) 209. However, as described in more detail below in connection with FIG. 4A, et seq., the plurality of discrete components to the laterally oriented access devices 230 (e.g., first source/drain region 221 and second source/drain region 223 separated by a channel region 225), extending laterally in the second direction (D2) 205, and the plurality of horizontally oriented digit lines 207-1, 207-2, . . . , 207-Q, extending laterally in the first direction (D1) 209, may be formed within different vertical layers within each level. For example, the plurality of horizontally oriented digit lines 207-1, 207-2, . . . , 207-Q, extending in the first direction (D1) 209, may be disposed on, and in electrical contact with, top surfaces of first source/drain regions 221 and orthogonal to laterally oriented access devices 230 (e.g., transistors) extending laterally in the second direction (D2) 205. In some embodiments, the plurality of horizontally oriented digit lines 207-1, 207-2, . . . , 207-Q, extending in the first direction (D1) 209 are formed in a higher vertical layer, farther from the substrate 200, within a level (e.g., within level (L1)) than a layer in which the discrete components (e.g., first source/drain region 221 and second source/drain region 223 separated by a channel region 225) of the laterally oriented access device are formed. In some embodiments, the plurality of horizontally oriented digit lines 207-1, 207-2, . . . , 207-Q, extending in the first direction (D1) 209, may be connected to the top surfaces of the first source/drain regions 221 directly and/or through additional contacts including metal silicides.

As shown in the example embodiment of FIG. 2, the access lines, 203-1, 203-2, . . . , 203-Q, extend in a vertical direction with respect to the substrate 200 (e.g., in a third direction (D3) 211). Further, as shown in FIG. 2, the access lines, 203-1, 203-2, . . . , 203-Q, in one sub cell array (e.g., sub cell array 101-2 in FIG. 1) may be spaced apart from each other in the first direction (D1) 209. The access lines, 203-1, 203-2, . . . , 203-Q, may be provided, extending vertically relative to the substrate 200 in the third direction (D3) 211 between a pair of the laterally oriented access devices 230 (e.g., transistors) extending laterally in the second direction (D2) 205, but adjacent to each other on a level (e.g., first level (L1)) in the first direction (D1) 209. Each of the access lines, 203-1, 203-2, . . . , 203-Q, may vertically extend, in the third direction (D3), on sidewalls of respective ones of the plurality of laterally oriented access devices 230 (e.g., transistors) that are vertically stacked.

For example, and as shown in more detail in FIG. 3, a first one of the vertically extending access lines (e.g., 203-1) may be adjacent a sidewall of a channel region 225 to a first one of the laterally oriented access devices 230 (e.g., transistors) in the first level (L1) 213-1, a sidewall of a channel region 225 of a first one of the laterally oriented access devices 230 (e.g., transistors) in the second level (L2) 213-2, and a sidewall of a channel region 225 a first one of the laterally oriented access devices 230 (e.g., transistors) in the third level (L3) 213-P, etc. Similarly, a second one of the vertically extending access lines (e.g., 203-2) may be adjacent a sidewall to a channel region 225 of a second one of the laterally oriented access devices 230 (e.g., transistors) in the first level (L1) 213-1, spaced apart from the first one of laterally oriented access devices 230 (e.g., transistors) in the first level (L1) 213-1 in the first direction (D1) 209. And the second one of the vertically extending access lines (e.g., 203-2) may be adjacent a sidewall of a channel region 225 of a second one of the laterally oriented access devices 230 (e.g., transistors) in the second level (L2) 213-2, and a sidewall of a channel region 225 of a second one of the laterally oriented access devices 230 (e.g., transistors) in the third level (L3) 213-P, etc. Embodiments are not limited to a particular number of levels.

The vertically extending access lines, 203-1, 203-2, . . . , 203-Q, may include a conductive material, such as, for example, one of a doped semiconductor material, a conductive metal nitride, metal, and/or a metal-semiconductor compound. The access lines, 203-1, 203-2, . . . , 203-Q, may correspond to word lines (WL) described in connection with FIG. 1.

As shown in the example embodiment of FIG. 2, a conductive body contact 295 may be formed extending in the first direction (D1) 209 along an end surface of the laterally oriented access devices 230 (e.g., transistors) in each level (L1) 213-1, (L2) 213-2, and (L3) 213-P above the substrate 200. The body contact 295 may be connected to a body, as shown by 336 in FIG. 3, (e.g., body region) of the laterally oriented access devices 230 (e.g., transistors) in each memory cell (e.g., memory cell 110 in FIG. 1). The body contact 295 may include a conductive material such as, for example, one of a doped semiconductor material, a conductive metal nitride, metal, and/or a metal-semiconductor compound.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3 illustrates in more detail a unit cell (e.g., memory cell 110 in FIG. 1) of the vertically stacked array of memory cells (e.g., within a sub cell array 101-2 in FIG. 1) according to some embodiments of the present disclosure. As shown in FIG. 3, the first and the second source/drain regions, 321 and 323, may be impurity doped regions to the laterally oriented access devices 330 (e.g., transistors). The first and the second source/drain regions, 321 and 323, may be analogous to the first and the second source/drain regions 221 and 223 shown in FIG. 2. The first and the second source/drain regions may be separated by a channel 325 formed in a body of semiconductor material (e.g., body region 326) of the laterally oriented access devices 330 (e.g., transistors). The first and the second source/drain regions, 321 and 323, may be formed from an n-type or p-type dopant doped in the body region 326. Embodiments are not so limited.

For example, for an n-type conductivity transistor construction, the body region 326 of the laterally oriented access devices 330 (e.g., transistors) may be formed of a low doped (p−) p-type semiconductor material. In some embodiments, the body region 326 and the channel 325 separating the first and the second source/drain regions, 321 and 323, may include a low doped, p-type (e.g., low dopant concentration (p−)) polysilicon material consisting of boron (B) atoms as an impurity dopant to the polycrystalline silicon. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples.

As used herein, a degenerate semiconductor material is intended to mean a semiconductor material, such as polysilicon, containing a high level of doping with significant interaction between dopants (e.g., phosphorous (P), boron (B), etc.). Non-degenerate semiconductors, by contrast, contain moderate levels of doping, where the dopant atoms are well separated from each other in the semiconductor host lattice with negligible interaction.

In this example, the first and the second source/drain regions, 321 and 323, may include a high dopant concentration, n-type conductivity impurity (e.g., high dopant (n+)) doped in the first and the second source/drain regions, 321 and 323. In some embodiments, the high dopant, n-type conductivity first and second drain regions 321 and 323 may include a high concentration of phosphorus (P) atoms deposited therein. Embodiments, however, are not limited to this example. In other embodiments, the laterally oriented access devices 330 (e.g., transistors) may be of a p-type conductivity construction in which case the impurity (e.g., dopant) conductivity types would be reversed.

As shown in the example embodiment of FIG. 3, the first source/drain region 321 may occupy an upper portion in the body 326 of the laterally oriented access devices 330 (e.g., transistors). For example, the first source/drain region 321 may have a bottom surface 324 within the body 326 of the laterally oriented access device 330 which is located higher, vertically in the third direction (D3) 311, than a bottom surface of the body 326 of the laterally, horizontally oriented access device 330. As such, the laterally, horizontally oriented transistor 330 may have a body portion 326 which is below the first source/drain region 321 and is in electrical contact with the body contact (e.g., 295 shown in FIG. 2). Further, as shown in the example embodiment of FIG. 3, a digit line (e.g., 307-1) analogous to the digit lines 207-1, 207-2, . . . , 207-Q in FIGS. 2 and 107-1, 107-2, . . . , 107-Q shown in FIG. 1, may disposed on a top surface 322 of the first source/drain region 321 and electrically coupled thereto.

As shown in the example embodiment of FIG. 3, an access line (e.g., 303-1 analogous to the access lines 203-1, 203-2, . . . , 203-Q in FIGS. 2 and 103-1, 103-2, . . . , 103-Q in FIG. 1) may be vertically extending in the third direction (D3) 311 adjacent sidewall of the channel region 325 portion of the body 326 to the laterally oriented access devices 330 (e.g., transistors) horizontally conducting between the first and the second source/drain regions 321 and 323 along the second direction (D2) 305. A gate dielectric material 304 may be interposed between the access line 303-1 (a portion thereof forming a gate to the laterally oriented access devices 330 (e.g., transistors) and the channel region 325.

The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

FIG. 4A is an overhead view illustrating a conventional three-dimensional (3D) memory device configuration. In such a configuration, a 3D DRAM array of vertically stacked memory cells (i.e., a memory cell array) may have a number of digit lines (e.g., 407-1, . . . , 407-2) (referred to collectively as digit lines 407) formed therein. Each digit line may run in a first horizontal direction (D1) 409.

Each digit line may be coupled to one or more access devices (not shown). For example, in the embodiment illustrated in FIG. 4A, a 3D DRAM array of vertically stacked memory cells 440 has two digit lines 407 formed therein and running parallel to one another in direction (D1) 409, and each of the digit lines 407 within the array region is coupled to a sense amplifier positioned within sense amplifier region 435 via interconnections 434-1, . . . , 434-S.

The interconnections 434-1, . . . , 434-S may each include a first portion extending in the (D1) 409 direction and a second portion extending in a (D2) 405 direction, such that each second portion may be coupled to one of the digit conductive lines 407 running in the (D1) 409 direction. This configuration of interconnections 434-1, . . . , 434-S and digit lines 407-1, . . . 407-Q adds additional device space (illustrated at 436-1) to the memory cell array 440, which may be undesirable if spatial constraints apply. Further, it may be difficult to fabricate the L-shaped connectors that form interconnections 434-1, . . . , 434-S.

FIG. 4B is an overhead view illustrating a configuration of a memory device in accordance with one or more embodiments of the present disclosure. The structure illustrated in FIG. 4B can reduce the overall space occupied by each interconnection area and, thus, by the memory device. The memory device may include a 3D array of vertically stacked memory cells 440 (i.e., a memory cell array), a number of interconnections 434-1, . . . , 434-S, and a sense amplifier area 435 having a number of sense amplifiers. Each of the number of interconnections 434-1, . . . , 434-S may be electrically coupled to the sense amplifier 435.

In some embodiments, the array of vertically stacked memory cells may, for example, be electrically coupled in an open digit line architecture. The array of vertically stacked memory cells can be electrically coupled in a folded digit line architecture, in other embodiments.

The 3D array 440 of vertically stacked memory cells may include a vertical stack of horizontally oriented conductive lines (e.g., 407-1, 407-2). The conductive lines may be digit lines or access lines (i.e. word lines). Each conductive line 407 formed within the array 440 may include a first portion 441-1, . . . , 441-2 extending in a first horizontal direction (D1) 409. Each conductive line may further include a second portion 442-1, . . . , 442-T extending in a second horizontal direction D2, at an angle to the first horizontal direction (D1) 409. In other words, the memory cell array 440 may include a number of multi-direction conductive lines 407 (also referred to as bent conductive lines).

For example, as shown in FIG. 4B, in some embodiments, the second portion of each conductive line (e.g., 442-1, 442-2) may extend in a second horizontal direction (D2) 405 at an angle to the first portion (e.g., perpendicular to the first horizontal direction (D1) 409).

Although FIG. 4B illustrates conductive lines 407-1 and 407-2 having two portions 442-1 and 442-2, embodiments of the present disclosure are not so limited. For example, in some embodiments, each conductive line may further include a third portion extending in a third direction. The third portion may extend in direction (D1) 409. The third portion may be coupled to an end of a second portion. Such an embodiment is shown and discussed, for example in FIG. 5C below.

As illustrated in FIG. 4B, a memory device may further include a number of horizontally oriented interconnections 434-1, . . . , 434-S. In some embodiments, each horizontally oriented interconnection 434-1, . . . , 434-S may be electrically coupled to the second portion 442-1, 442-2 of a conductive line 407-1, 407-2. In some embodiments, each interconnection 434-1, . . . , 434-S may be coupled to a second portion 442-1, 442-2 of a conductive line 407-1, 407-2 through a horizontally oriented storage node. These horizontally oriented storage nodes may include capacitor cells.

Conductive lines 407-1, 407-2 may be coupled to sense amplifier region 435 through the interconnections 434-1, . . . , 434-S. In some embodiments, the conductive lines 407-1, 407-2 may be digit lines, and the sense amplifier region 435 may include a number of sense amplifiers. Although not illustrated herein, in some embodiments, the conductive lines 407-1, 407-2 may be access lines (i.e., word lines), which may not be coupled to a sense amplifier region 435 but may instead be coupled to one or more other circuitry components (e.g., word line drivers) via contacts.

The multi-direction conductive line configuration illustrated in FIG. 4B can reduce spatial constraints by allowing the interconnections 434-1, . . . , 434-S to occupy less space (i.e., to take up space 436-2 which is less than space 436-1 of FIG. 4A). Coupling each interconnection 434-1, . . . , 434-S to a second portion 442-1, 442-2 of each digit line 407-1, 407-2 as illustrated in FIG. 4B can reduce the overall space occupied by a conventional memory device as illustrated in FIG. 4A.

Although not illustrated in FIG. 4B, the 3D array 440 may include a plurality of vertical levels, which may also be referred to as a plurality of groups of layers. Each vertical level may include one or more layers with one or more digit lines 407 formed therein.

In some embodiments, each second portion 442-1, . . . , 442-T of each conductive line 407 may be of a length greater than the second portion 442-1, . . . , 442-T of a conductive line 407 on a lower vertical level. Thus, if the 3D array is comprised of levels L1, L2, . . . , LN and L1 is the top level of the vertical stack, the length of the second portions of the conductive lines of L1 may be less than the length of the second portions of the conductive lines of L2, . . . , LN. For example, given that FIG. 4B is an overhead view, the conductive lines 407-1 and 407-2 illustrated in FIG. 4B may be formed on a top level L1 of the vertical 3D array 440. Thus, the conductive lines 407-1 and 407-2 may each include a second portion 442-1 and 442-2 of a length less than the second portions of each conductive line on the lower levels of the 3D array 440.

Figure 5A:
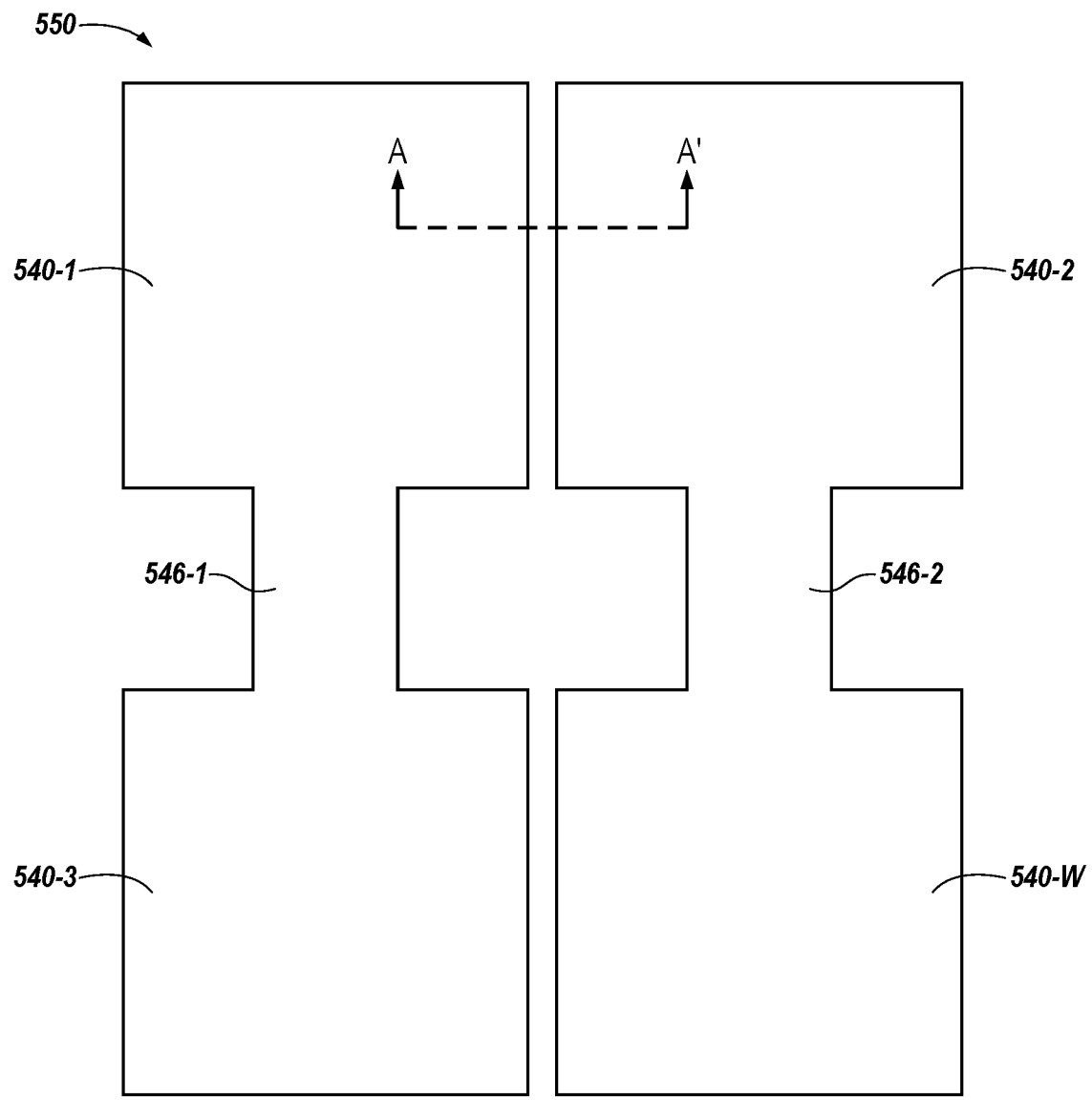
FIGS. 5A-5S illustrate an example method for forming arrays of vertically stacked memory cells in accordance having multi-direction conductive line and staircase conductive line contact structures with one or more embodiments of the present disclosure.
Figure 5B:
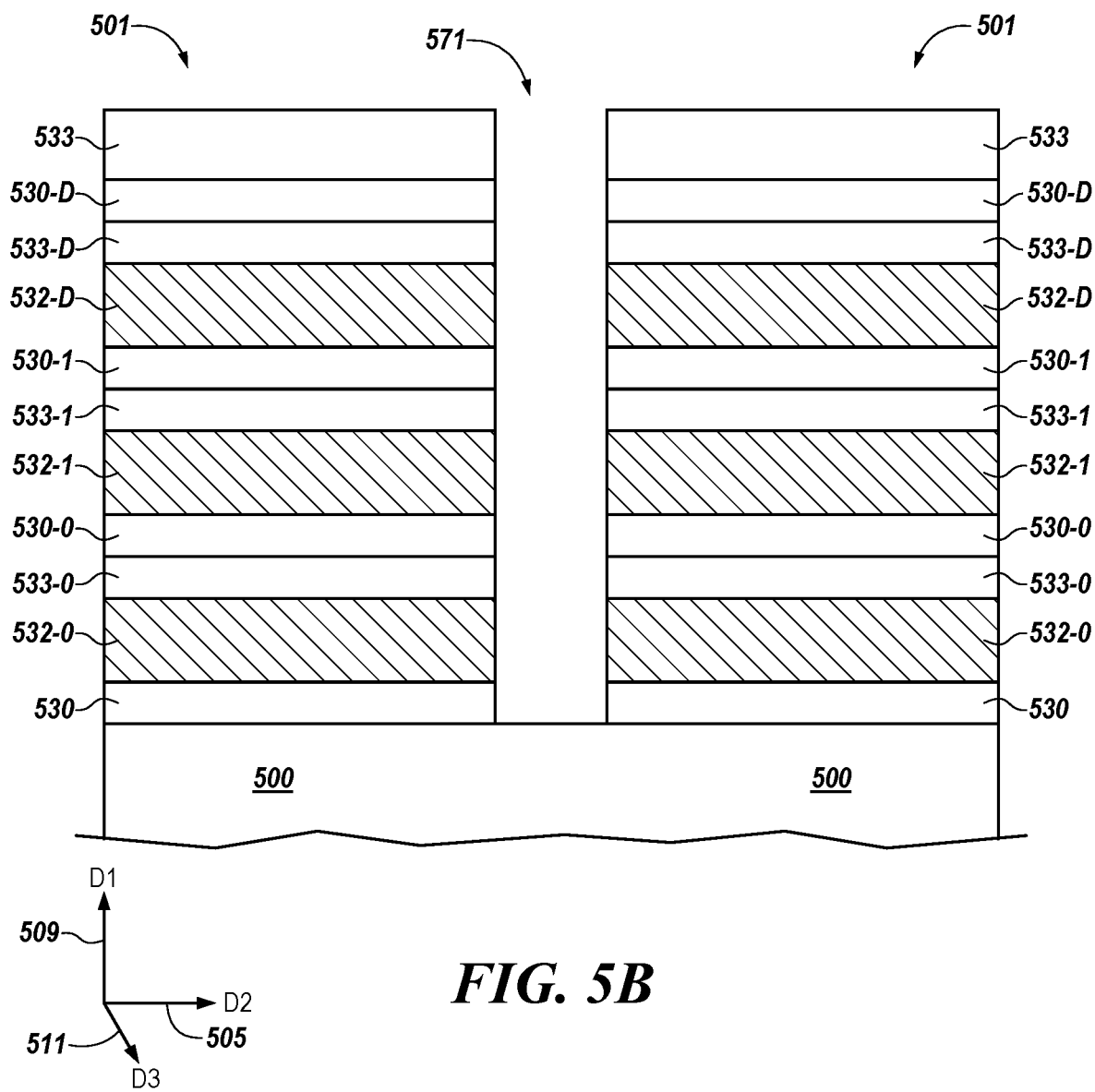
Figure 5C:
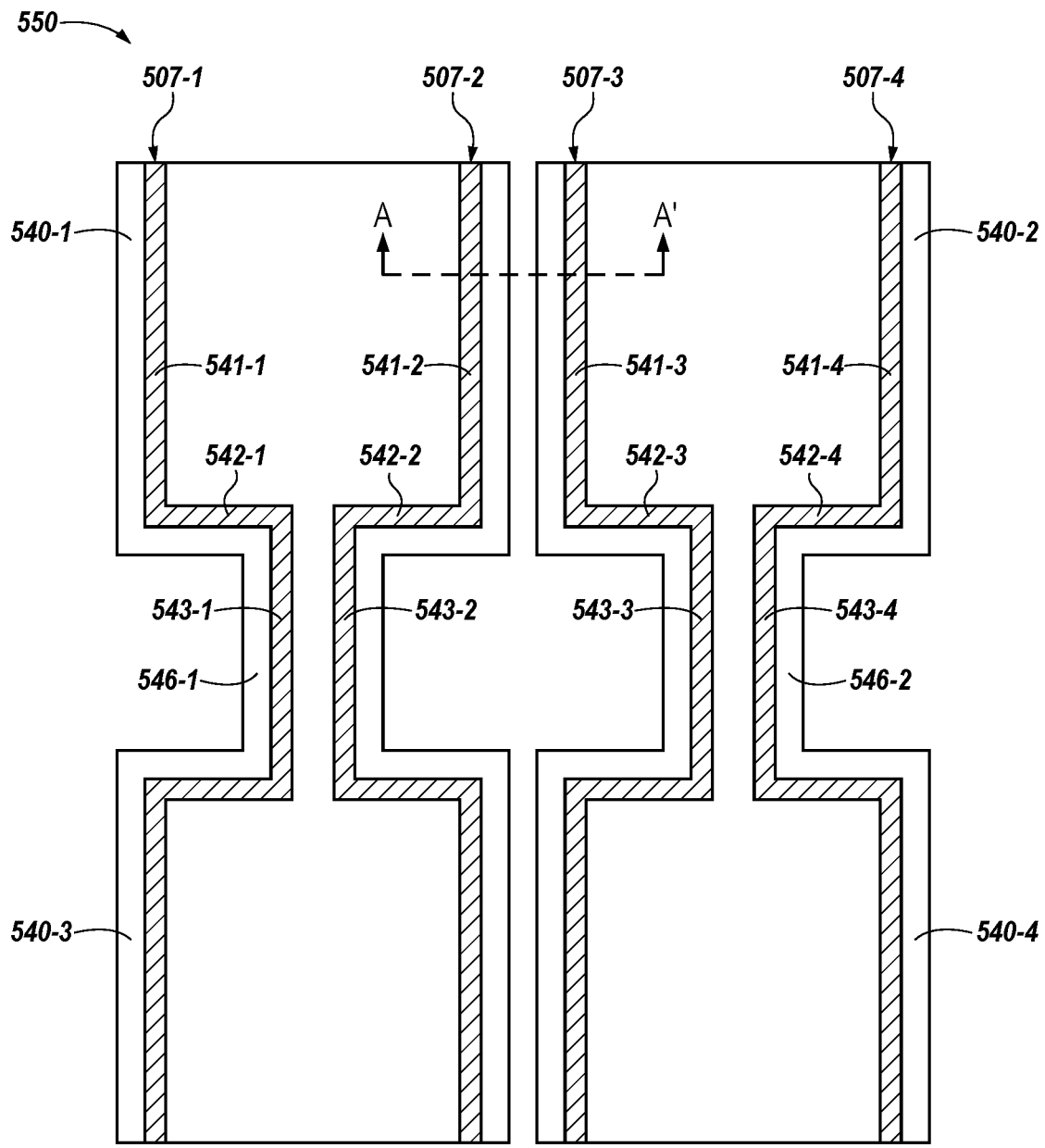
Figure 5D:
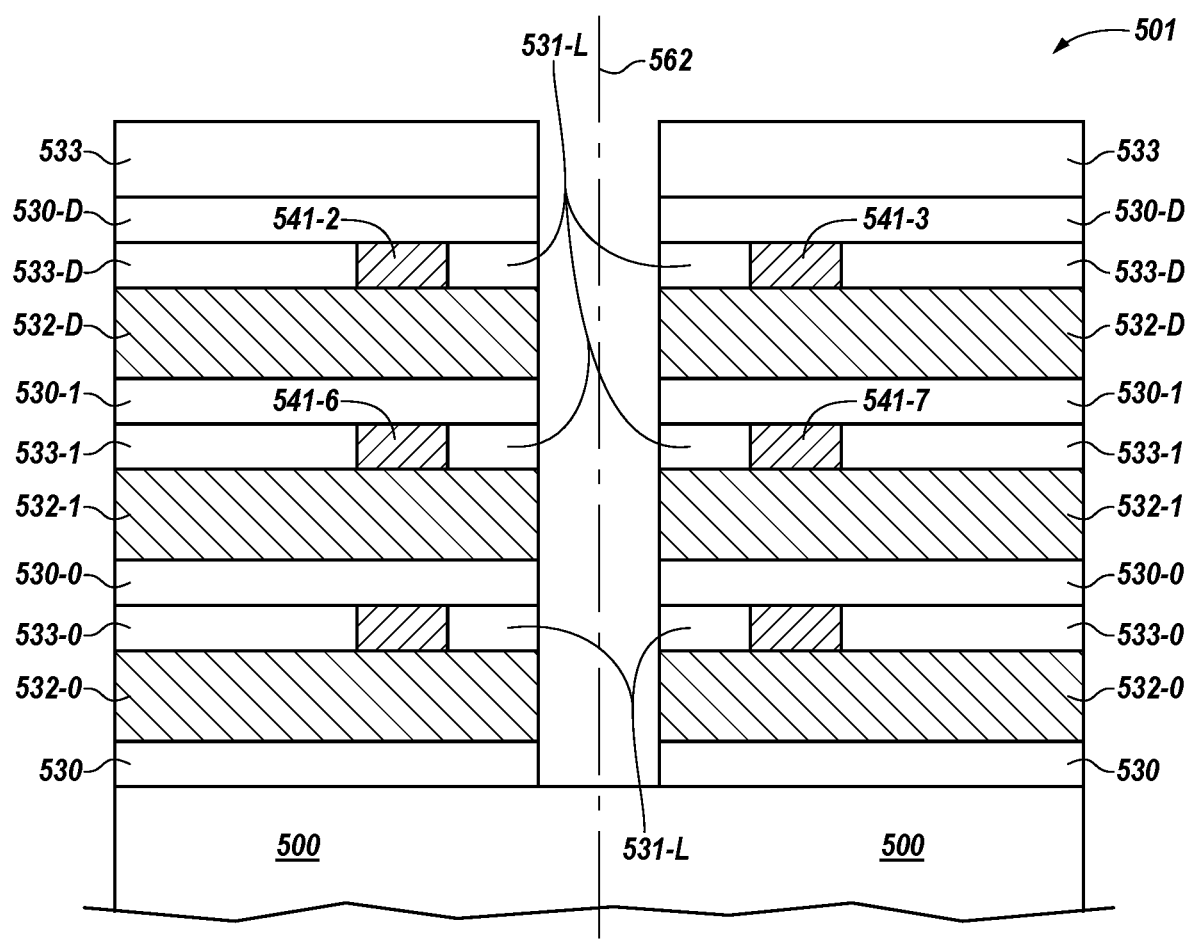
Figure 5E:
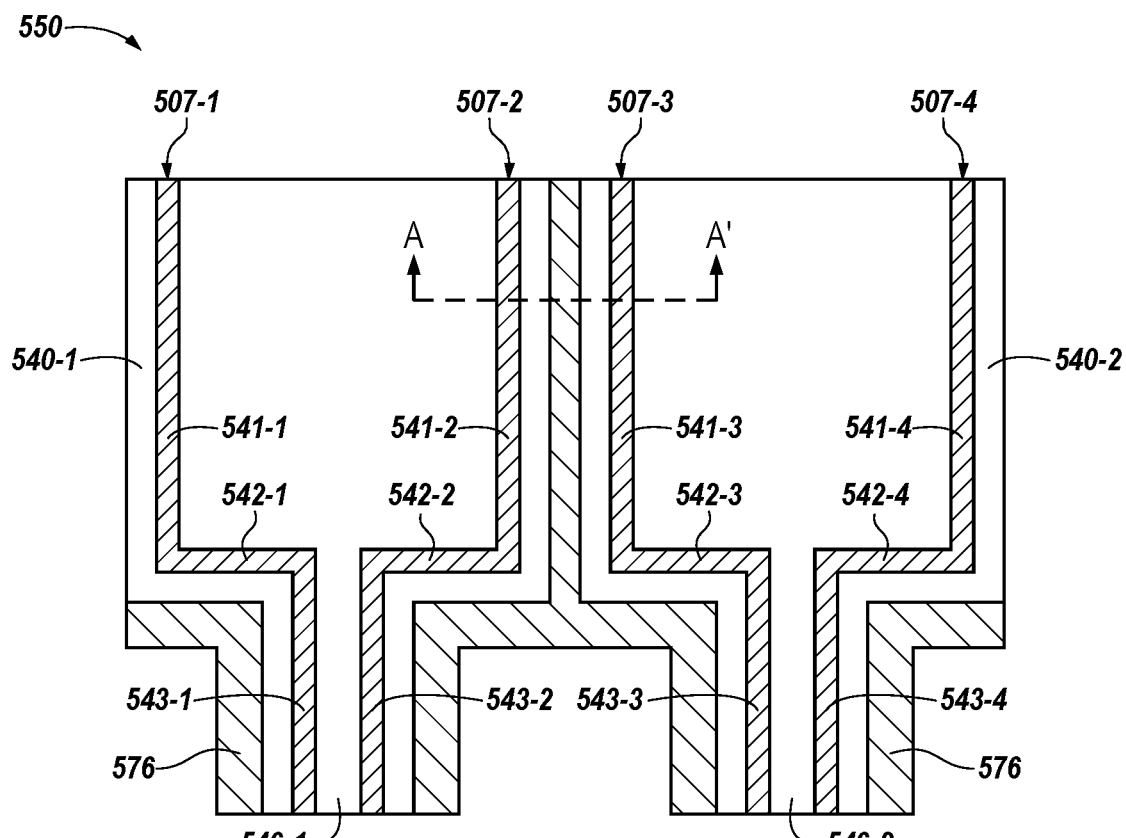
Figure 5F:
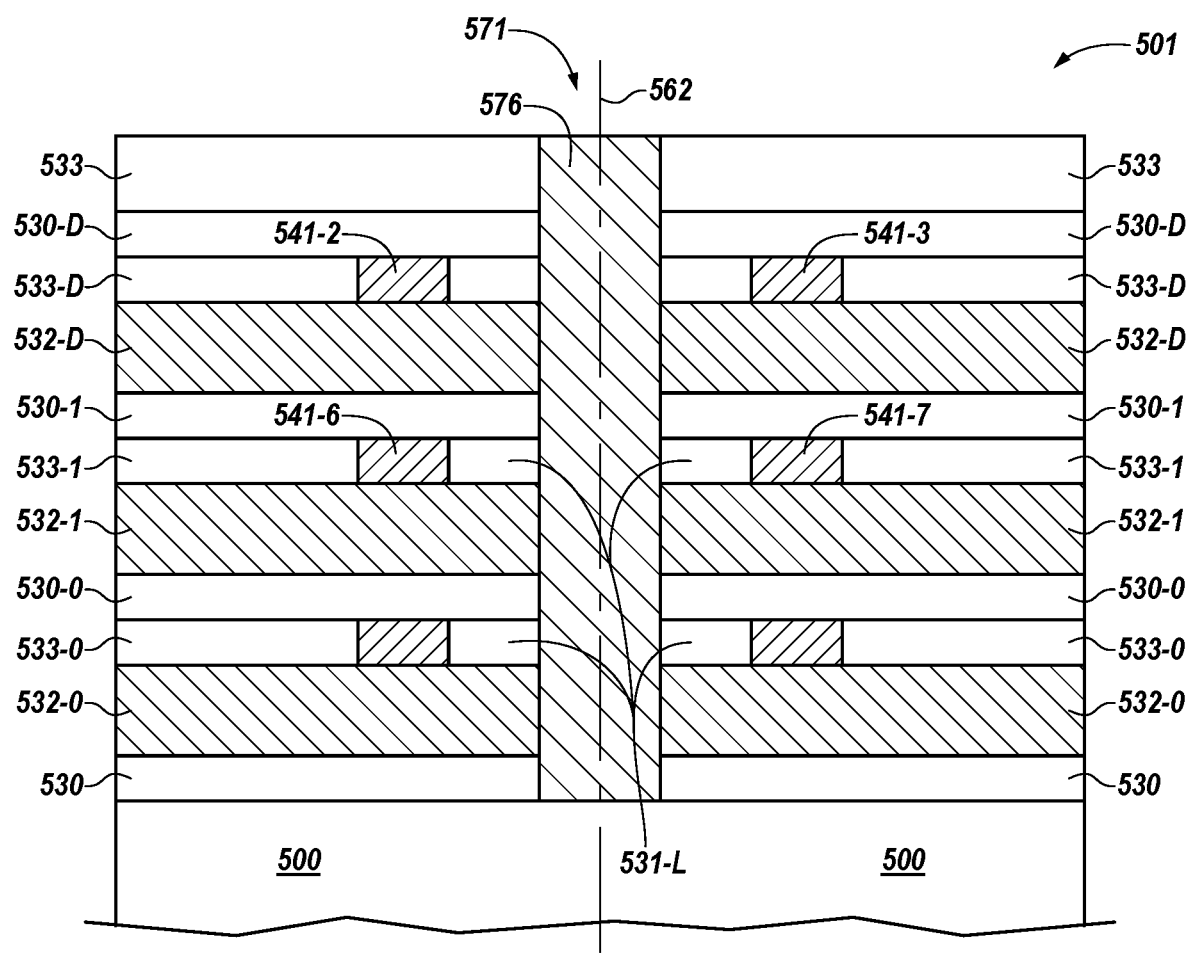
Figure 5G:
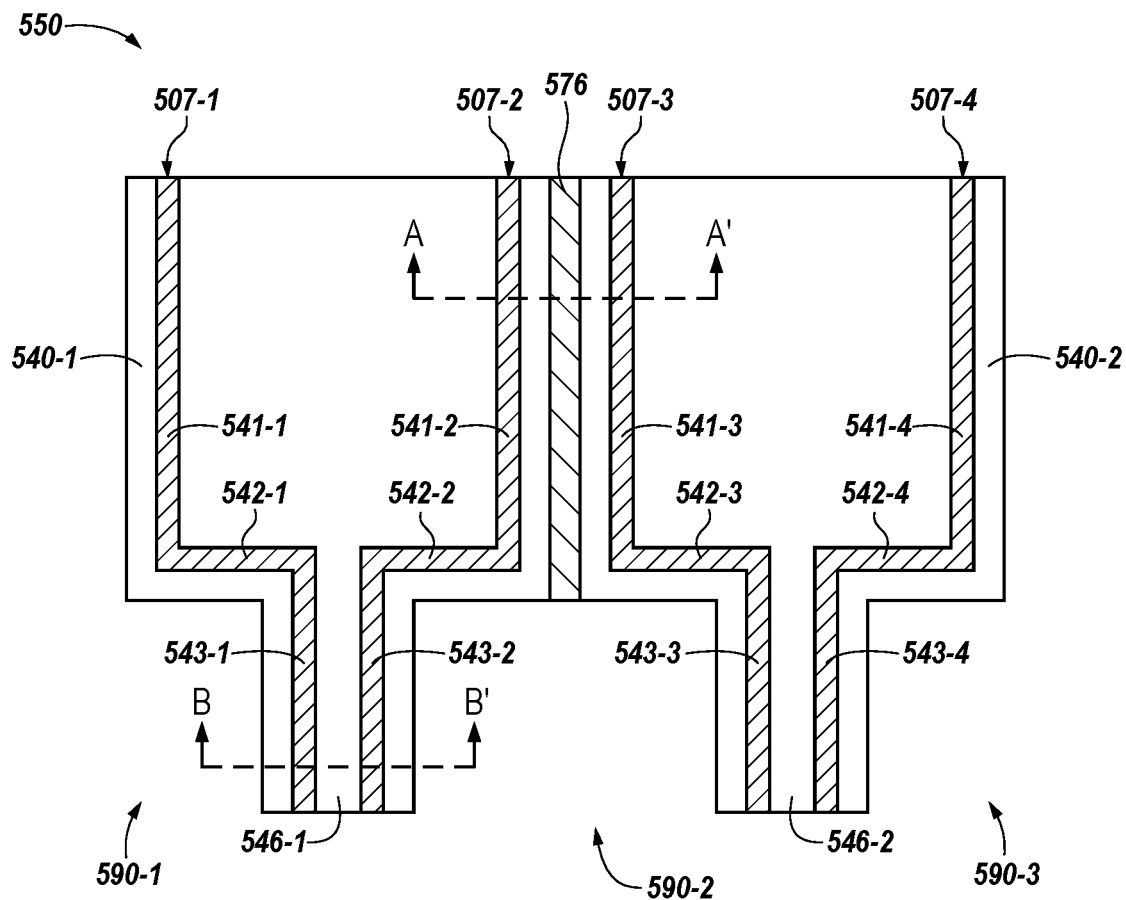
Figure 5H:
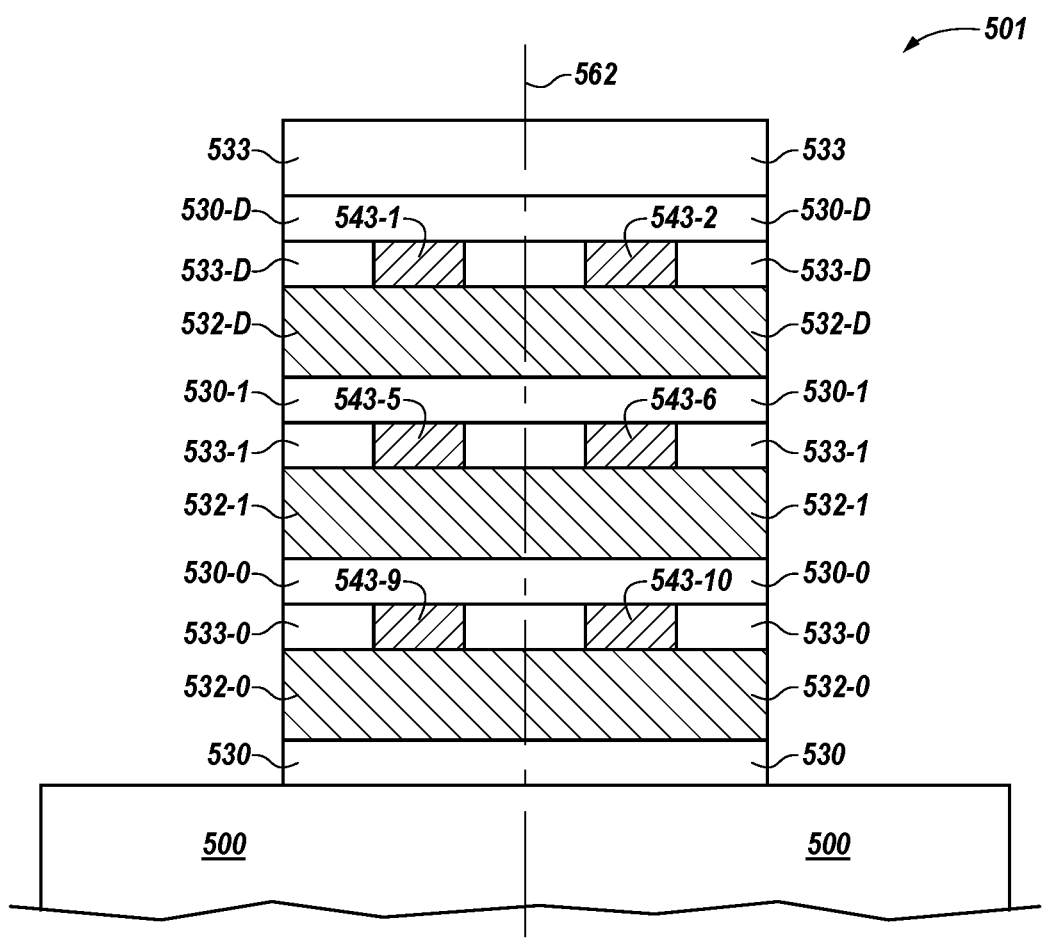
Figure 5I:
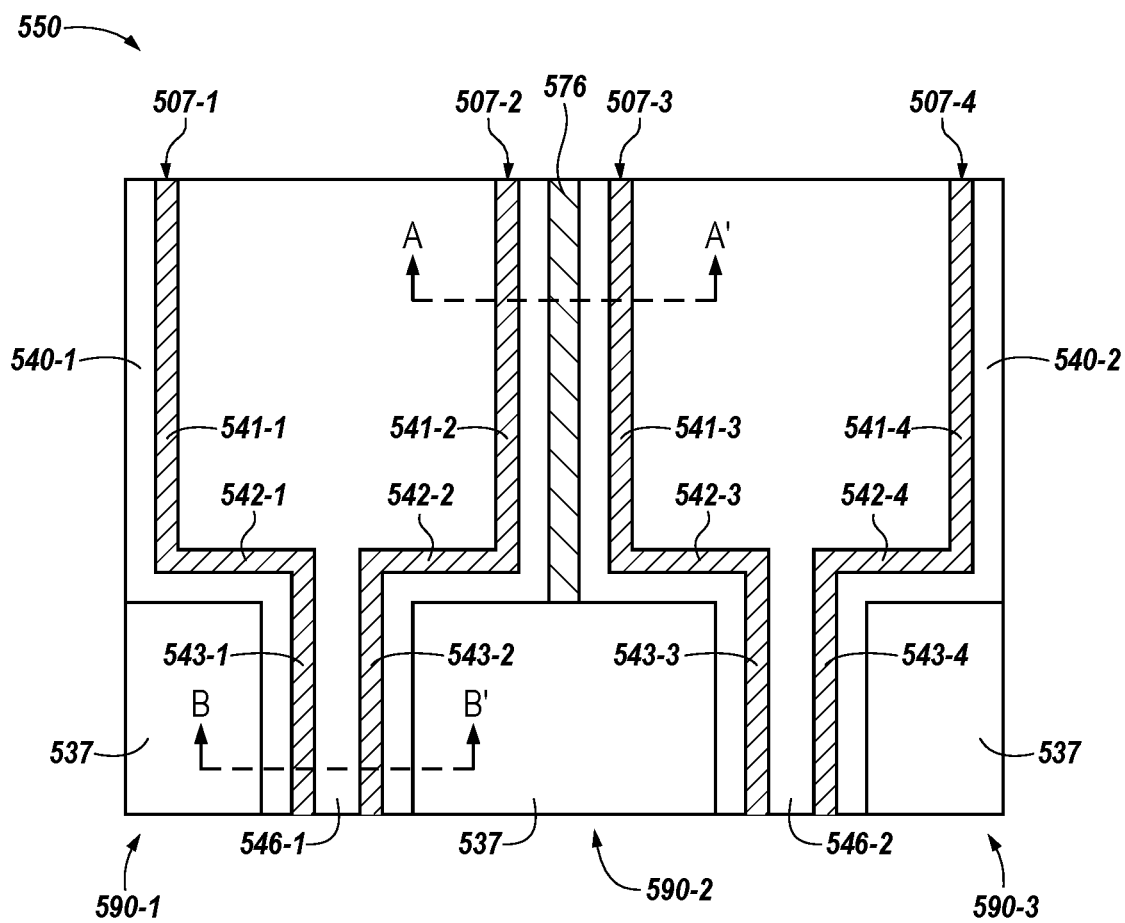
Figure 5J:
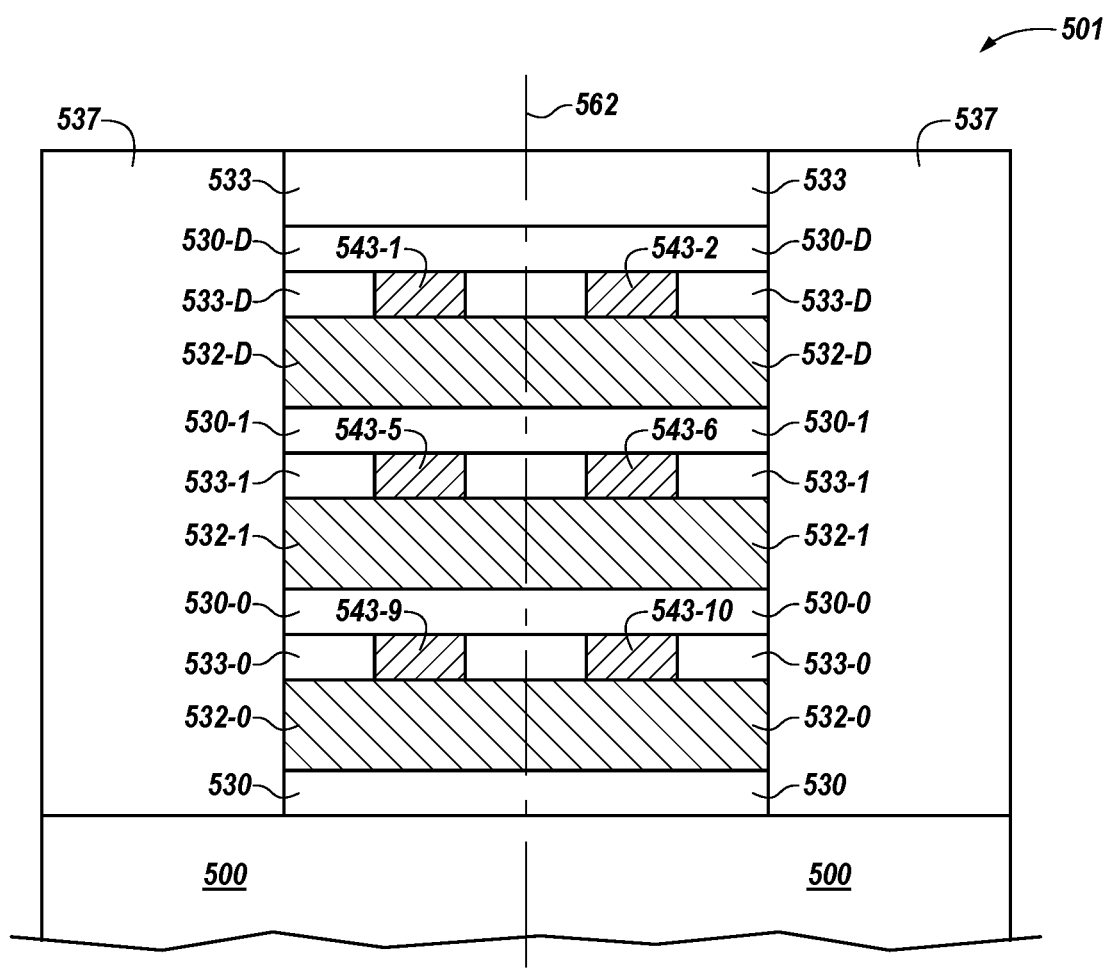
Figure 5K:
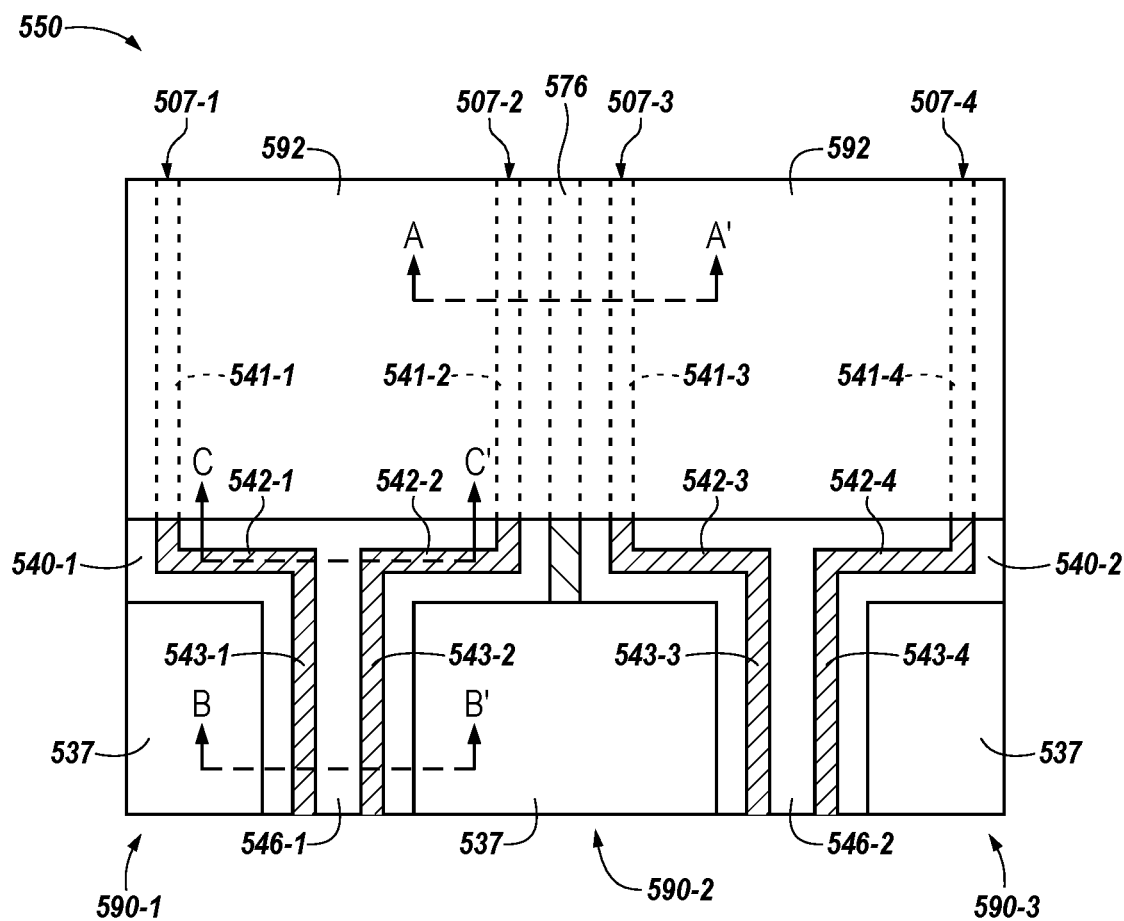
Figure 5L:
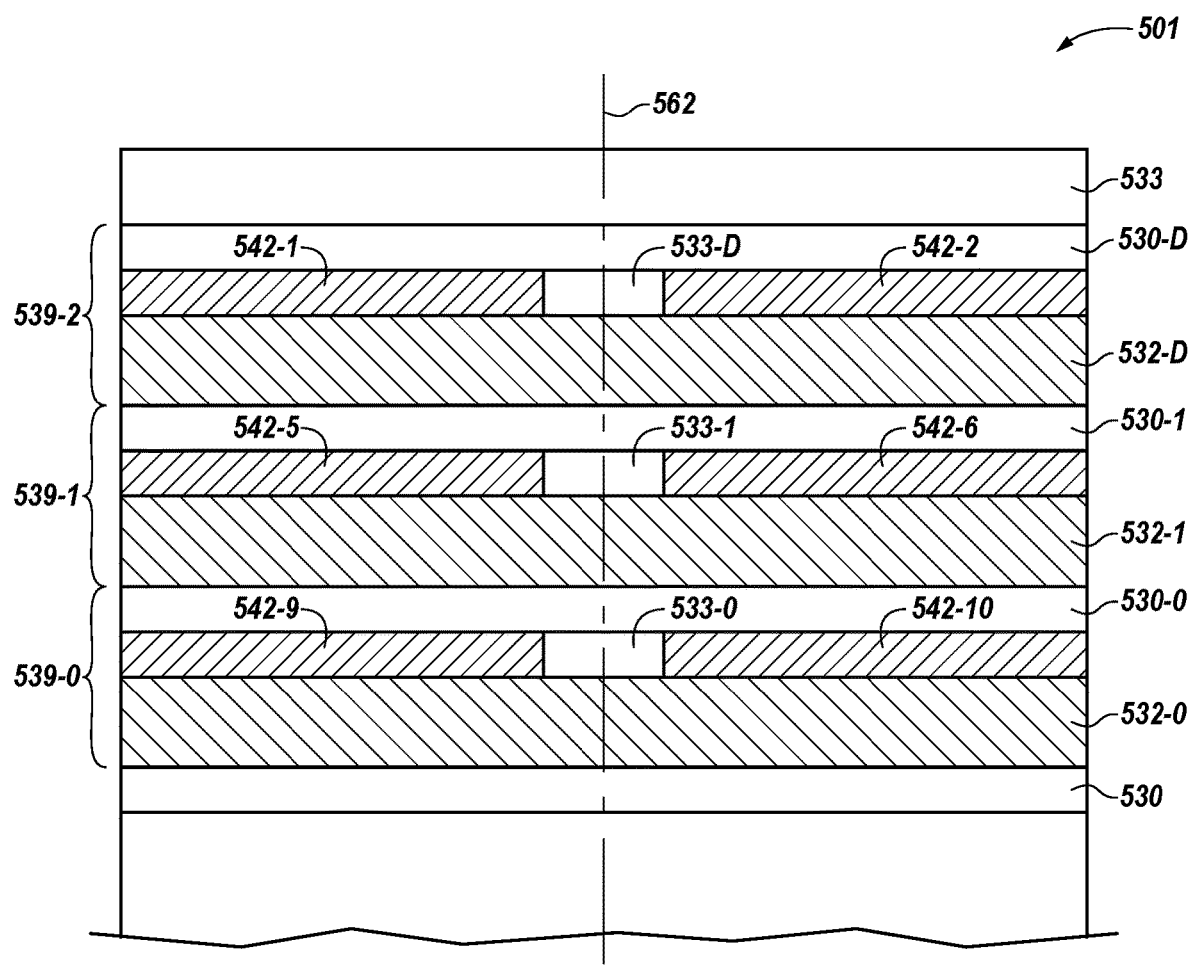
Figure 5M:
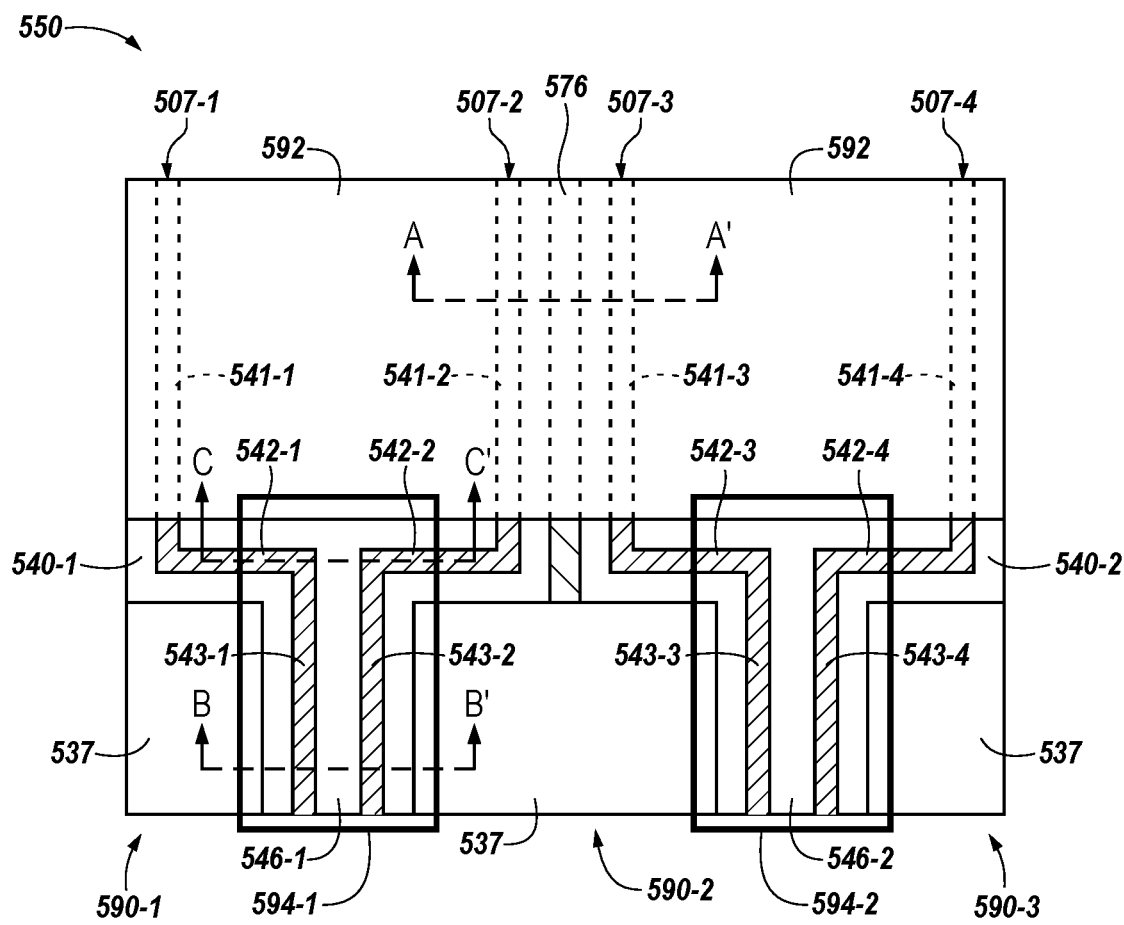
Figure 5N:
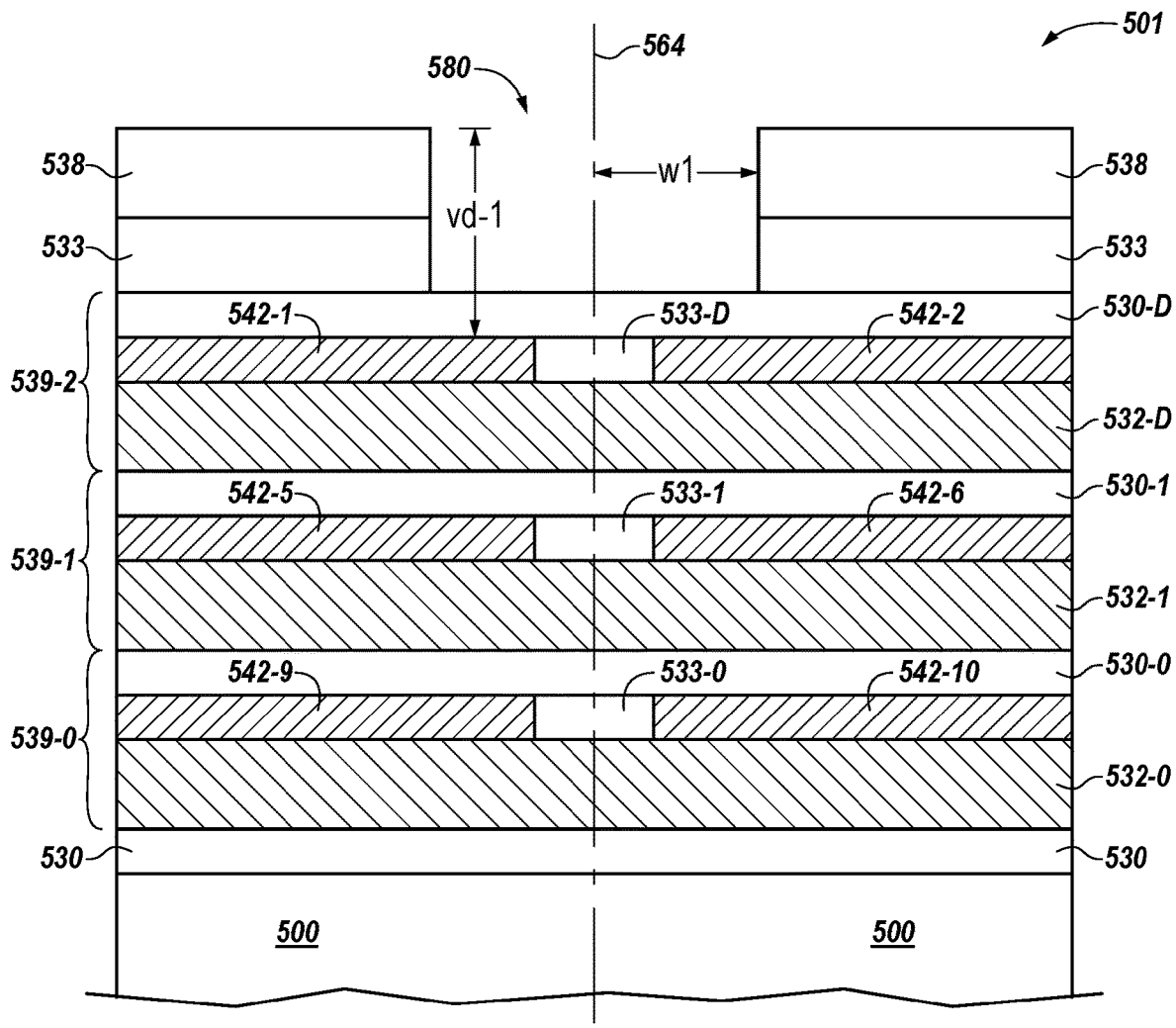
Figure 5O:
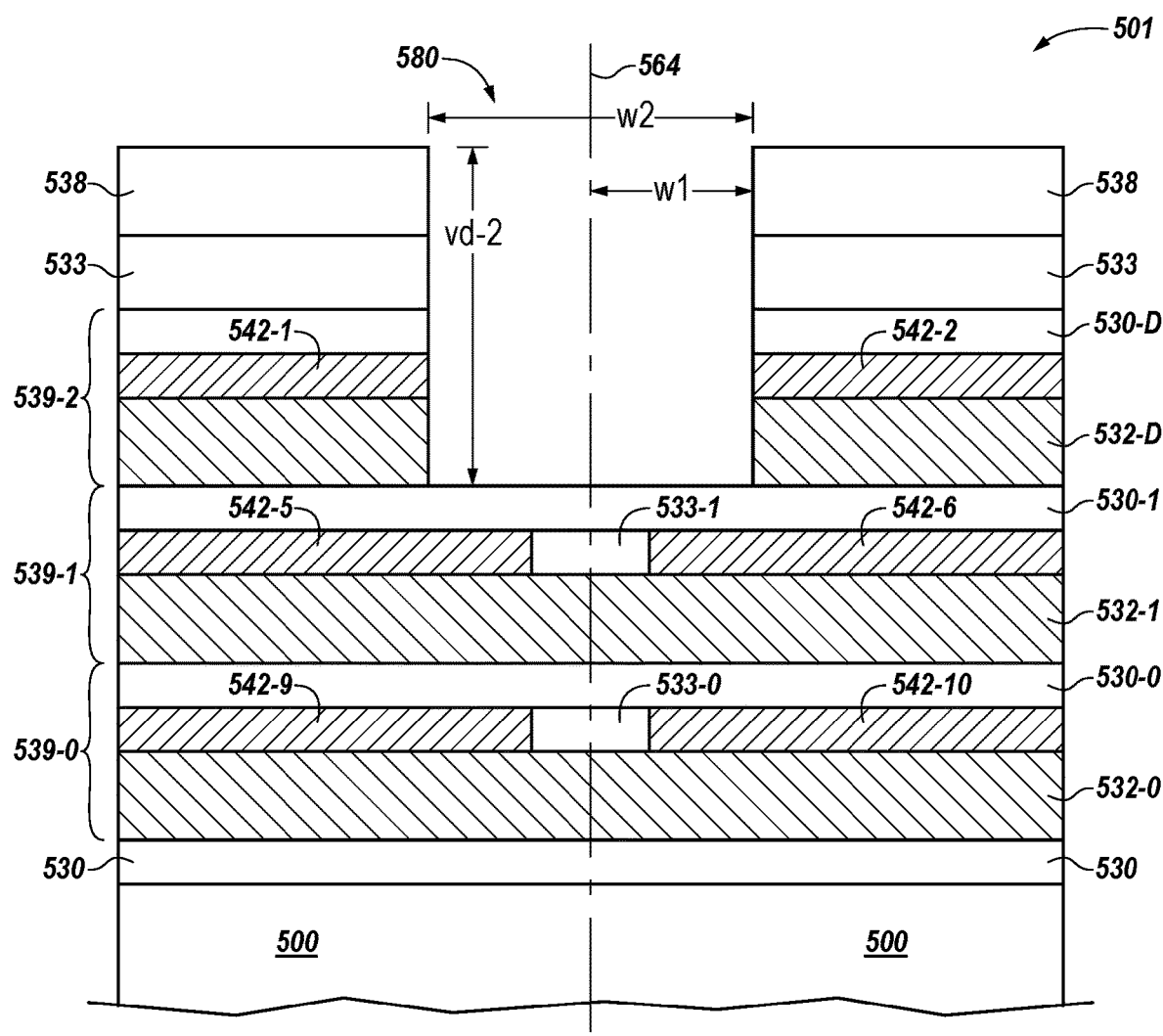
Figure 5P:
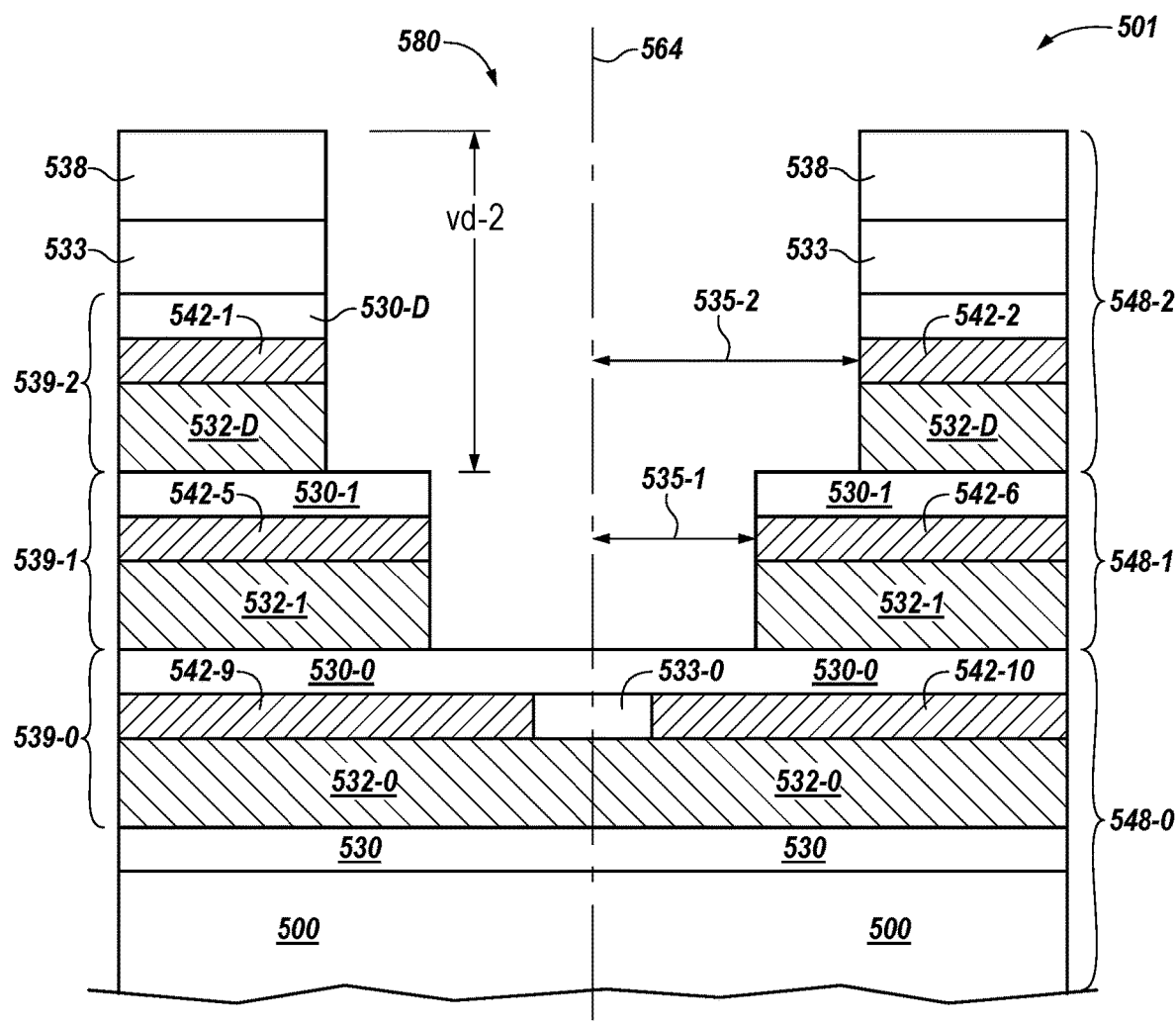
Figure 5Q:
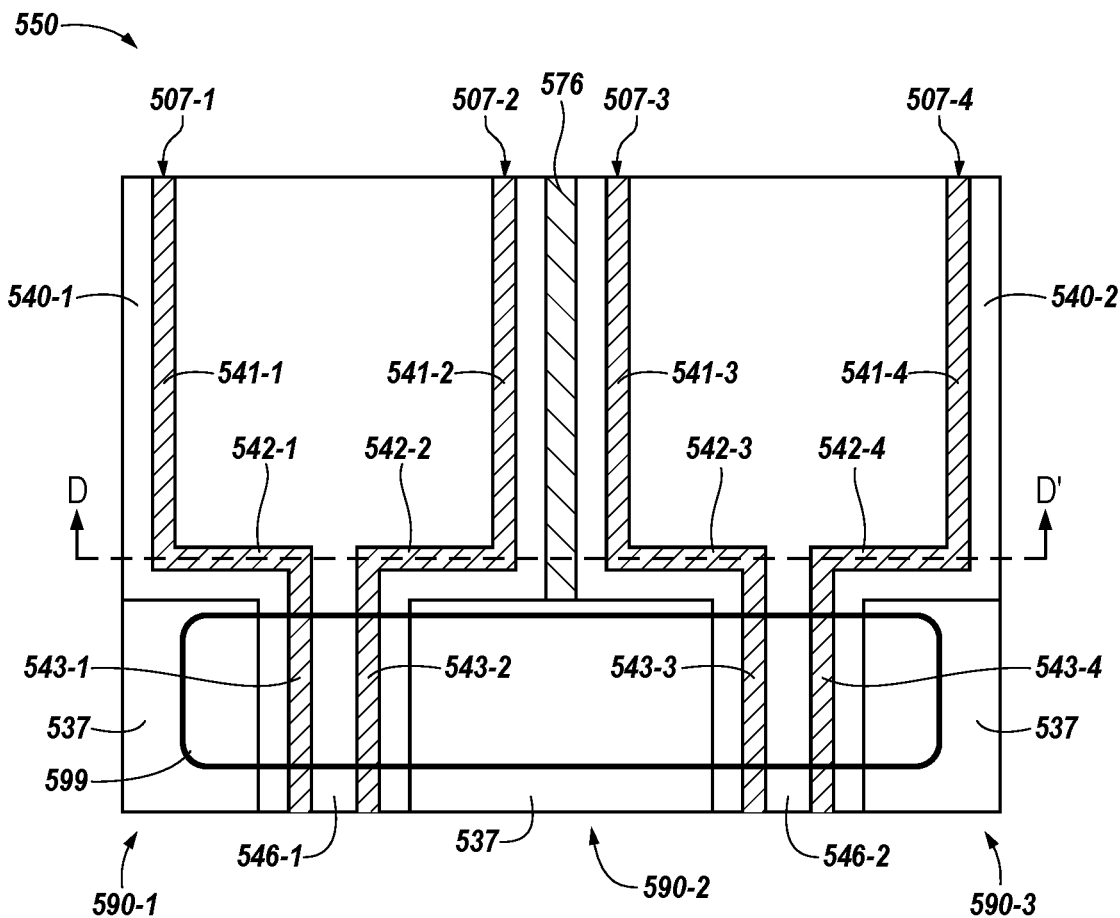
Figure 5R:
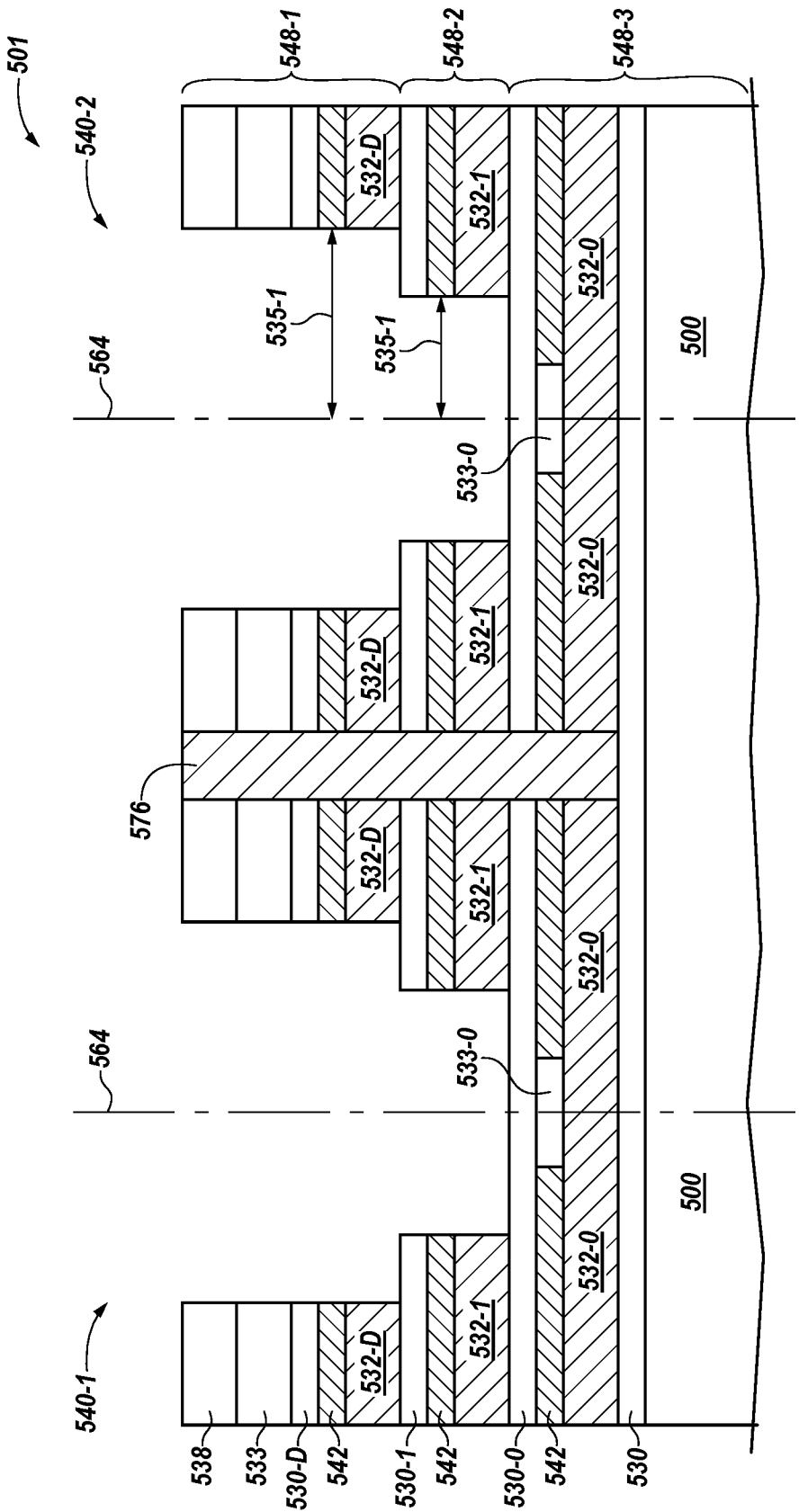
Figure 5S:
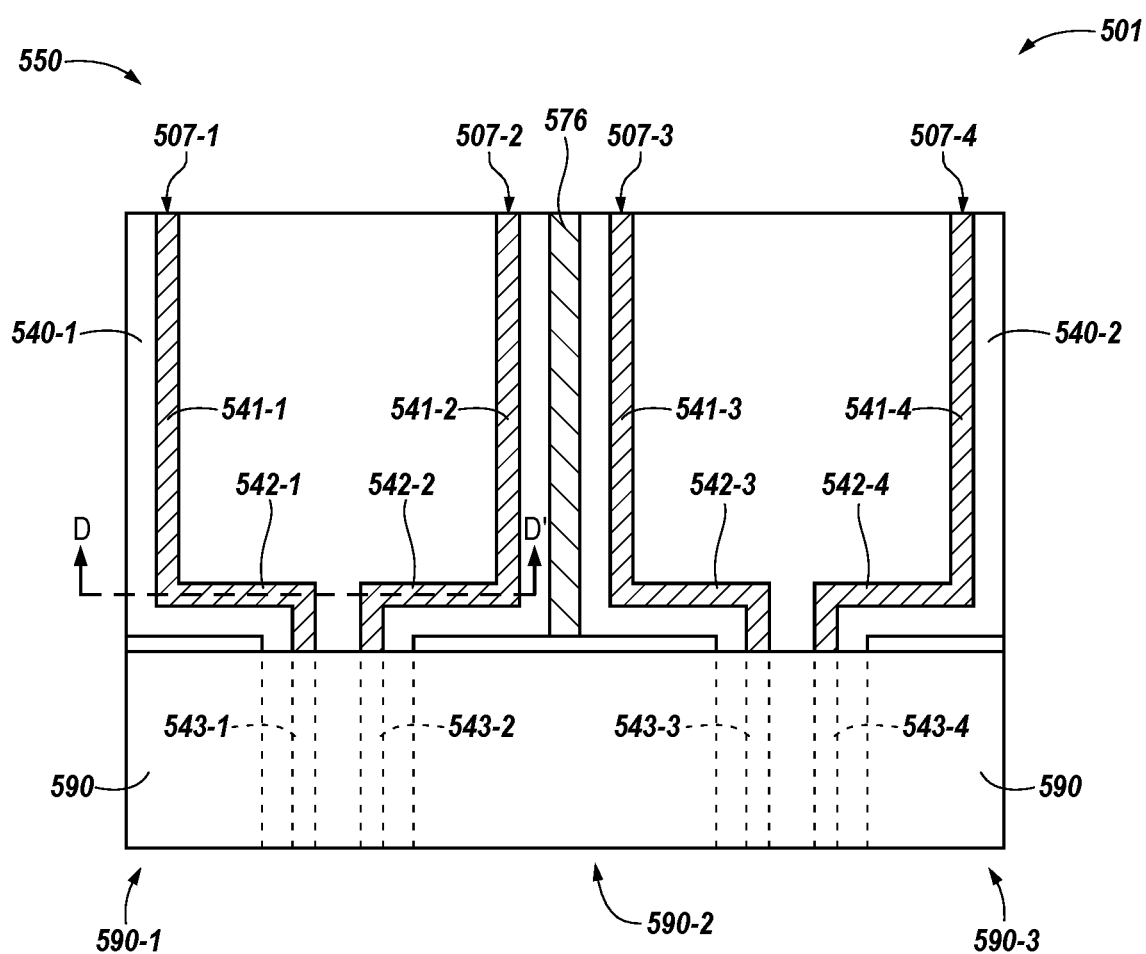

FIGS. 5A-5S illustrate an example method for forming arrays of vertically stacked memory cells in accordance with one or more embodiments of the present disclosure. FIG. 5A is an overhead view illustrating a memory device configuration in accordance with a number of embodiments of the present disclosure.

As illustrated, a memory device may include a number of 3D array regions 540-1, . . . , 540-W (i.e., a number of memory cell arrays). Each of these array regions 540-1, . . . , 540-W includes vertically stacked memory cells (e.g., memory cell 110 of FIG. 1). The number of memory cell array regions 540-1, . . . , 540-W may be positioned in a configuration to form an array 550. Each memory cell array regions 540-1, . . . , 540-W may be coupled to an adjacent array regions 540-1, . . . , 540-W in the same column through a bridge 546 (e.g., 546-1, 546-2).

FIG. 5B is a cross-sectional view along line A-A' of FIG. 5A illustrating a stage of a process for forming a multi-directional conductive line and staircase contact for semi-conductor devices, such as illustrated in FIGS. 1-3, and in accordance with one or more embodiments of the present disclosure. As illustrated in FIG. 5B, the method includes forming alternating layers of a first dielectric material, 530-0, 530-1 . . . , 530-D (collectively referred to as first dielectric material 530), a semiconductor material, 532-0, 532-1, . . . , 532-D (collectively referred to as semiconductor material 532), and a second dielectric material, 533-0, 533-1, . . . , 533-D (collectively referred to as second dielectric material 533), in repeating iterations to form a vertical stack 501 on a working surface of a substrate 500, analogous to substrate 200 in FIG. 2. In some embodiments, the method may further include depositing a top layer of the first dielectric material 530 and a top layer of the second dielectric material 533 above the alternating layers. As shown in FIG. 5B, a horizontal direction is illustrated as a first horizontal direction (D3) (e.g., Y-direction in an X-Y-Z coordinate system) analogous to the first direction (D2), among first, second, and third directions, shown in FIG. 4A and FIG. 4B. A second horizontal direction (D3) is also illustrated in FIG. 5B (e.g., X-direction in an X-Y-Z coordinate system) analogous to the second horizontal direction (D3) shown in FIG. 4A and FIG. 4B. A vertical direction (D1) (e.g., Z-direction in an X-Y-Z coordinate system) is also illustrated in FIG. 5B and is analogous to the vertical direction (D1) shown in FIG. 4A and FIG. 4B.

In some embodiments, the first dielectric material may be an interlayer dielectric (ILD). By way of example, and not by way of limitation, the first dielectric material may include a silicon nitride ($Si_3N_4$) material (also referred to herein as ("SiN"). In another example, the first dielectric material may include a silicon oxy-carbide material ($SiO_XN_Y$) material (also referred to herein as "SiON"), and/or combinations thereof. Embodiments are not limited to these examples.

In some embodiments, the semiconductor material may include a silicon material. The semiconductor material may be in a polycrystalline and/or amorphous state. The semiconductor material may, for example, be a low doped, p-type (p–) silicon material. The semiconductor material may, for instance, be formed by gas phase doping boron atoms (B), as an impurity dopant, at a low concentration to form the low doped, p type (p–) silicon material. In some embodiments, the low doped, p-type (p–) silicon material may be a polysilicon material. Embodiments, however, are not limited to these examples.

In some embodiments, the second dielectric material may be an interlayer dielectric (ILD). By way of example, and not by way of limitation, the second dielectric material may include a nitride material. The nitride material may be a silicon nitride ($Si_xN_4$) material (also referred to herein as ("SiN").

In another example, the second dielectric material, 533-0, 533-1, ..., 533-D, may include a silicon oxy-carbide (SiOC) material. In another example, the second dielectric material may include silicon oxy-nitride (SiON), and/or combinations thereof. Embodiments are not limited to these examples. However, according to some embodiments, the second dielectric material can be purposefully chosen to be different in material or composition than the first dielectric material, such that a selective etch process may be performed on one of the first and second dielectric layers, selective to the other one of the first and second dielectric layers, (e.g., the second SiN dielectric material may be selectively etched relative to the semiconductor material.

The repeating iterations of alternating first dielectric material, 530-0, 530-1, ..., 530-D layers, semiconductor material, 532-0, 532-1, ..., 532-D layers, and second dielectric material, 533-0, 533-1, ..., 533-D layers may be deposited according to a semiconductor fabrication process such as chemical vapor deposition (CVD) in a semiconductor fabrication apparatus. Embodiments, however, are not limited to this example, and other suitable fabrication techniques may be used to deposit the alternating layers of a first dielectric material, a semiconductor material, and a second dielectric material, in repeating iterations to form the vertical stack 501.

In the example of FIG. 5B, three levels of the repeating iterations are shown. For example, the stack may include: a first dielectric material 530-1, a semiconductor material 532-1, a second dielectric material 533-1, a third dielectric material 530-2, a second semiconductor material 532-2, a fourth dielectric material 533-2, a fifth dielectric material 530-3, a third semiconductor material 532-3, and a sixth dielectric material 533-3. As such, a stack may include: a first oxide material 530-1, a first semiconductor material 532-1, a first nitride material 533-1, a second oxide material 530-2, a second semiconductor material 532-2, a second nitride material 533-2, a third oxide material 530-D, a third semiconductor material 532-D, and a third nitride material 533-D in further repeating iterations. Embodiments, however, are not limited to this example, and more or fewer repeating iterations may be included.

It should be noted by the reader that, although not illustrated in FIG. 5A or FIG. 5B, a number of trenches may be formed between rows of interconnections of the memory cell array. The number of trenches may be configured such that conductive lines may be formed therein. Conductive lines formed in these trenches may be referred to as "undercut" or "buried" digit lines. An example of the conductive lines (e.g., 507-1/507-2) is shown in subsequent figures.

FIG. 5C is an overhead view of another stage of a method for forming arrays of vertically stacked memory cells with horizontally oriented digit lines and vertically oriented access lines. As shown in FIG. 5C, conductive lines 507-1, ..., 507-4 may be formed within the second dielectric (e.g., 533-0, 533-1, ..., 533-D, in FIG. 5B). The conductive lines in the present disclosure include portions (e.g., 541-1, 542-1, 543-1 and 541-2, 542-2, 543-2) that are at angles to each other, such as when they progress through the array regions 540-1, ..., 540-4 and bridges 546-1, 546-2. These conductive lines 507-1, ..., 507-4 may, for example, be aligned with the edge of a perimeter of each array region 540-1, ..., 540-4 and bridge 546-1, 546-2 (i.e., running generally parallel to an edge of the array region or bridge, as shown). In some embodiments, the conductive lines may be in an undercut or buried formation (e.g., as shown in FIG. 5D).

FIG. 5D is a cross-sectional view, along line A-A' of FIG. 5C, illustrating a stage of a method for forming multi-directional digit lines and staircase contacts for semiconductor devices, such as illustrated in FIGS. 1-3, and in accordance with a number of embodiments of the present disclosure.

In some embodiments, conductive lines may be formed within the one or more layers of the second dielectric material 533-0, 533-1, ..., 533-D of the stack. This may be achieved through a conductive line formation process including, for example, forming the vertical opening 571, selectively removing the second dielectric material 533-0, 533-1, ..., 533-D (e.g., via a lateral etch process through vertical opening 571) to form a first horizontal opening by removing the second dielectric material to a first distance back from a reference line 562 (e.g., a center line in vertical opening 571 between memory cell stacks 501).

The conductive line formation process may further include depositing a conductive material into the vertical opening. In some embodiments, this may include conformally depositing the conductive material into a portion of the vertical opening 571 (e.g., using a chemical vapor deposition (CVD) process) such that the conductive material may also be deposited into the first horizontal opening. In some embodiments, the conductive material may include a titanium nitride (TiN) material. The conductive material may form a horizontally (e.g., laterally) oriented digit line.

The conductive material may then be recessed back in the horizontal opening (e.g., etched away from the vertical opening using reactive ion etching or other suitable techniques). In some examples, the conductive material may be removed back in the horizontal opening a second distance from the vertical opening, to form the digit line. The conductive material may be selectively etched, leaving the dielectric material 530, a portion of the conductive material, and the semiconductor material 532 intact. The conductive material may be etched to define the desired conductive line width. In some embodiments, the conductive material may be etched using an atomic layer etching (ALE) process. In some embodiments, the conductive material 577 may be etched using an isotropic etch process.

As such, the conductive material may be selectively removed a second distance back from the vertical opening, forming a smaller horizontal opening between the first dielectric 530-0, 530-1, . . . , 530-D and semiconductor 532-0, 532-1, . . . , 532-D layers. A third dielectric 531-L may then be deposited into each of the horizontal openings laterally adjacent to the conductive material. In some embodiments, the third dielectric material 531-L may be identical or similar to the second dielectric material 533. For example, in some embodiments, the second dielectric material 533 and third dielectric material 531-L may each include a nitride material.

The third dielectric material 531-L may be recessed back to a second distance from the reference line 562 to remove it from the first vertical opening 571 and maintain the first vertical opening 571 to allow for deposition of a conductive material to form a direct, electrical contact between such conductive material deposited within the vertical opening 571 and the low doped semiconductor material 532-0, . . . , 532-D (e.g., body region contact) of a horizontally oriented interconnection (e.g., access device) (not pictured in FIG. 5D) within the memory cell array region 540. In some embodiments, the third dielectric material 531-L may be removed away from the vertical opening to expose the sidewalls of the first dielectric material 530-0, . . . , 530-D, the third dielectric material 531-L, and the semiconductor material 532-0, . . . , 532-D.

FIG. 5E is an overhead view of another stage of a method for forming multi-direction conductive lines and body contacts for semiconductor devices in accordance with one or more embodiments of the present disclosure. For simplicity, FIG. 5E illustrates the top half of array 550, however, the description of the method described with respect to FIG. 5E can be applied to those elements in the bottom half of array 550 as well.

Such a method may include depositing a conductive material 576 (e.g., polysilicon) over, around, or between the one or more memory cell regions 540-1, . . . , 540-4 and bridges 546-1, 546-2, for example, for body bias control during this part of the formation process. The conductive material 576 may include, for example, a conductive polymer material. In some embodiments, the conductive material 576 may form a doped body contact to the number of interconnections described in connection with FIG. 4B. The conductive material 576 can also be etched back as appropriate.

Although FIG. 5E only illustrates two memory cell regions 540-1 and 540-2, embodiments of the present disclosure are not so limited. For example, a conductive material 576 may be deposited on, around, or between four memory cell array regions of an array 550, among other arrangements of cell arrays.

FIG. 5F is a cross-sectional view of line A-A' in FIG. 5E, which is analogous to line A-A' in FIG. 5C and line A-A' in FIG. 5A. As shown in FIG. 5F, the vertical opening 571 between the memory cell array regions 540-1 and 540-2 may be filled with the conductive material 576 as a result of the process described in connection with FIG. 5E.

FIG. 5G is an overhead view of another stage of a method for forming multi-directional conductive lines and staircase contacts for semiconductor devices. As shown in FIG. 5G, the conductive material 576 may be partially removed from regions 590 (e.g., 590-1, . . . , 590-3). Although not shown in FIG. 5G, a mask (e.g., a photoresist layer) may be deposited over regions 590 before the conductive material 576 is removed.

FIG. 5H is a cross-sectional view along line B of FIG. 5G after the processes described in connection with FIG. 5G have been performed. FIG. 5H illustrates conductive lines 507-1, . . . , 507-4 already formed at this stage. However, embodiments of the present disclosure are not so limited. For example, in some embodiments, the areas of conductive lines 507-1, . . . , 507-4 illustrated in FIG. 5H may include empty trenches, and those trenches may be filled with a conductive material at a later stage to form conductive lines.

FIG. 5I is an overhead view of another stage of a method for forming multi-direction digit lines and staircase contacts for semiconductor devices in accordance with one or more embodiments of the present disclosure. As shown in FIG. 5I, a fourth dielectric material 537 (e.g., a spin on dielectric) may be deposited into regions 590 around and between bridges 546-1 and 546-2. In some embodiments, the fourth dielectric material 537 may be similar or identical to the first dielectric material 530. For example, in some embodiments, the first dielectric material 530 and the fourth dielectric material 537 may each include an oxide material.

FIG. 5J is a cross-sectional view along line B-B' of FIG. 5I after the process described in connection with FIG. 5I has been performed. As with FIG. 5I. FIG. 5J shows a fourth dielectric material 537 may be deposited into regions on the sides of the stack.

FIG. 5K is an overhead view of another stage of a method for forming multi-direction conductive lines in accordance with one or more embodiments of the present disclosure. In some embodiments, a hard mask material 592 (e.g., a photoresist layer) may be deposited over a region of the array regions 540-1, 540-2. In other embodiments, a hard mask material 592 may be deposited over a portion of each memory array region. The hard mask material 592 may serve to protect the memory cell array regions and body contacts during subsequent processing steps described below (e.g., staircase formation steps). In other words, the hard mask material 592 may serve as a protective layer to keep the portions of the memory cell array 540 that are not being removed intact during the removal process.

FIG. 5L illustrates a cross-sectional view along line C-C' of FIG. 5K. In other words, FIG. 5L illustrates a cross-sectional view along the second portions 542-1 and 542-2 of digit lines shown in FIG. 5K. As illustrated in FIG. 5L, each memory cell region includes a vertical stack 501 of horizontally oriented conductive lines, each conductive line comprising a portion 542, extending in a horizontal direction.

Each memory cell region may include a number of groups of layers (e.g., 539-1, 539-2, 539-3), which may be referred to as "tiers," with each tier including a first dielectric material layer 530-0, . . . , 530-D, a semiconductor material layer 532-0, . . . , 532-D, and a second dielectric material layer 533-0, . . . , 533-D with conductive lines 541 formed therein. The second dielectric material layer 533-0, . . . , 533-D of each group of layers 539-0, . . . , 539-2 may include second portions 542 of one or more conductive lines. Each memory cell 540-1, . . . , 540-W may include a layer 533 of a second dielectric material above the top group of layers 539-2.

FIG. 5M is an overhead view of another stage of a method for forming multi-direction conductive lines and staircase contacts for semiconductor devices in accordance with one or more embodiments of the present disclosure. As shown in FIG. 5M, in some embodiments, each conductive line may include a third portion 543-1, . . . , 543-4 extending in a third horizontal direction at an angle to the second horizontal direction. In some embodiments, the third portion 543-1, ..., 543-4 may extend at an angle perpendicular to the second portion 542-1, ..., 542-4 and parallel to the first portion 541-1, ..., 541-4.

In some embodiments, a masking, patterning, and etching process can be used to open regions 594 (e.g. regions 594-1, ..., 594-2) and form a staircase structure as described below. Regions 594 may each be a region between two portions 543-1, ..., 543-4 of conductive lines 507-1, ..., 507-4 of a memory cell array region 540-1, ..., 540-2.

In some embodiments, regions 594-1, ..., 594-2 may extend from a portion 542-1, ..., 542-4 of a conductive line 507-1, ..., 507-4 to another adjacent memory cell array region 540-1, ..., 540-2 of the memory device. Regions 594 may include vertically stacked groups of layers as described in connection with FIG. 5L. For example, regions 594-1, ..., 594-2 may include vertically stacked groups of layers, where each group of layers includes a first dielectric material layer, a semiconductor layer, and a second dielectric material layer with digit lines formed therein. For example, regions 594-1, ..., 594-2 may include groups of layers 539-0, ..., 539-2 as shown in FIG. 5L.

Imaginary reference lines may, for example, run through the centers of each memory cell array. A vertical opening may be formed, as illustrated in FIG. 5N. In some embodiments, the reference line may be central to the vertical opening. In some embodiments, the vertical opening may be centered around the intersection of the reference line and line C-C'.

FIG. 5N is a cross-sectional view along line C-C' of FIG. 5M. As shown in FIG. 5N, a vertical opening 580 may be formed through the layers within the vertically stacked memory cells to expose vertical sidewalls in the vertical stack 501. Reference lines 564 may be used to indicate where the vertical opening is to be positioned at each memory cell array region.

The vertical opening 580 may be of a first horizontal width ("w1" in FIG. 5N) and a first vertical depth ("vd-1" shown in FIG. 5N). The vertical opening 580 may be formed by selectively removing the top layers 538, 533 and then one or more groups of layers 539-0, ..., 539-2 of the vertical stack 501. The one or more groups of layers 539-0, ..., 539-2 of the vertical stack 501 be selectively removed a first distance on each side of the reference line 564 (i.e., to the left of the reference line 564 and the first distance to the right of the reference line 564).

In some embodiments, the vertical opening 580 may be formed through a mask 538 and the second dielectric material 533. Forming the vertical opening 580 may include removing a first portion of a mask 538 and a first portion of a second dielectric layer 533. The first portions of the mask 538 and second dielectric material later 533 may be equivalent in horizontal length. Although not shown in FIG. 5N, in some embodiments where a mask 538 has not been deposited over the vertical stack 501, the vertical opening 580 may be formed through a top layer of the second dielectric material 533.

As shown in FIG. 5N, the vertical stack 501 may include layers of the second dielectric material 533 with portions 541 of digit lines formed therein. In some embodiments, the vertical opening 580 may be formed by removing each layer of material between the top of the vertical stack 501 and the first layer of the second dielectric material 533 containing the next conductive line.

As shown in FIG. 5N, the vertical stack 501 may include multiple levels (e.g., tiers) 539-0, ..., 539-2 (e.g., three tiers shown in FIG. 5N), with each level 539-0, ..., 539-2 including a layer of the semiconductor material 532, a layer of the first dielectric material 530, and a layer of the second dielectric material 533 with one or more conductive lines formed therein. The vertical stack 501 may include any number of such levels 539-0, ..., 539-2. As discussed herein, the vertical stack 501 may be formed on a substrate 500.

FIG. 5O is a cross-sectional view along line C-C' of FIG. 5M illustrating another stage of a method for forming multi-direction conductive lines and staircase contacts for semiconductor devices in accordance with one or more embodiments of the present disclosure. The vertical depth of the vertical opening 580 may be increased to a second vertical depth "vd-2". This may be done by removing a layer of the second dielectric material 533-D, where the layer 533-D also contains first portions 541-1 and 541-2 of conductive lines formed therein. A layer of the semiconductor material 532-D may also be removed. This may be done by selectively removing the layer of the second dielectric material 533-D and the layer of the semiconductor material 532-D. At this stage, the first width w1 from the reference line 564 may be maintained, as shown in FIG. 5O, with an overall width being w2.

FIG. 5P is a cross-sectional view along line C-C' of FIG. 5M illustrating another stage of a method for forming multi-direction conductive lines and staircase contacts in accordance with one or more embodiments of the present disclosure. The method may include creating a first level 548-1 and a second level 548-2 of an array region. This may be done by removing a first portion of each layer of a first group of layers a second distance 535-2 back from the reference line 564 on either side, where the second distance 535-2 is greater than the first distance 535-1.

In some embodiments, the top level 548-2 may include a mask 538 (e.g., a photoresist layer), a top second dielectric material layer 533, a first dielectric material layer 530-D, portions 541-1 and 541-2 of the conductive lines originally formed within a second dielectric material 533, and a semiconductor material layer 532-D. However, embodiments of the present disclosure are not so limited. For example, in other embodiments, the first level may include a mask, a second dielectric material 533 and conductive line layer, a semiconductor material 532 layer, and a first dielectric material 530 layer. The top level may also just include a first dielectric material layer, a second dielectric material layer with conductive lines formed therein, and a semiconductor material layer.

Figure 6:
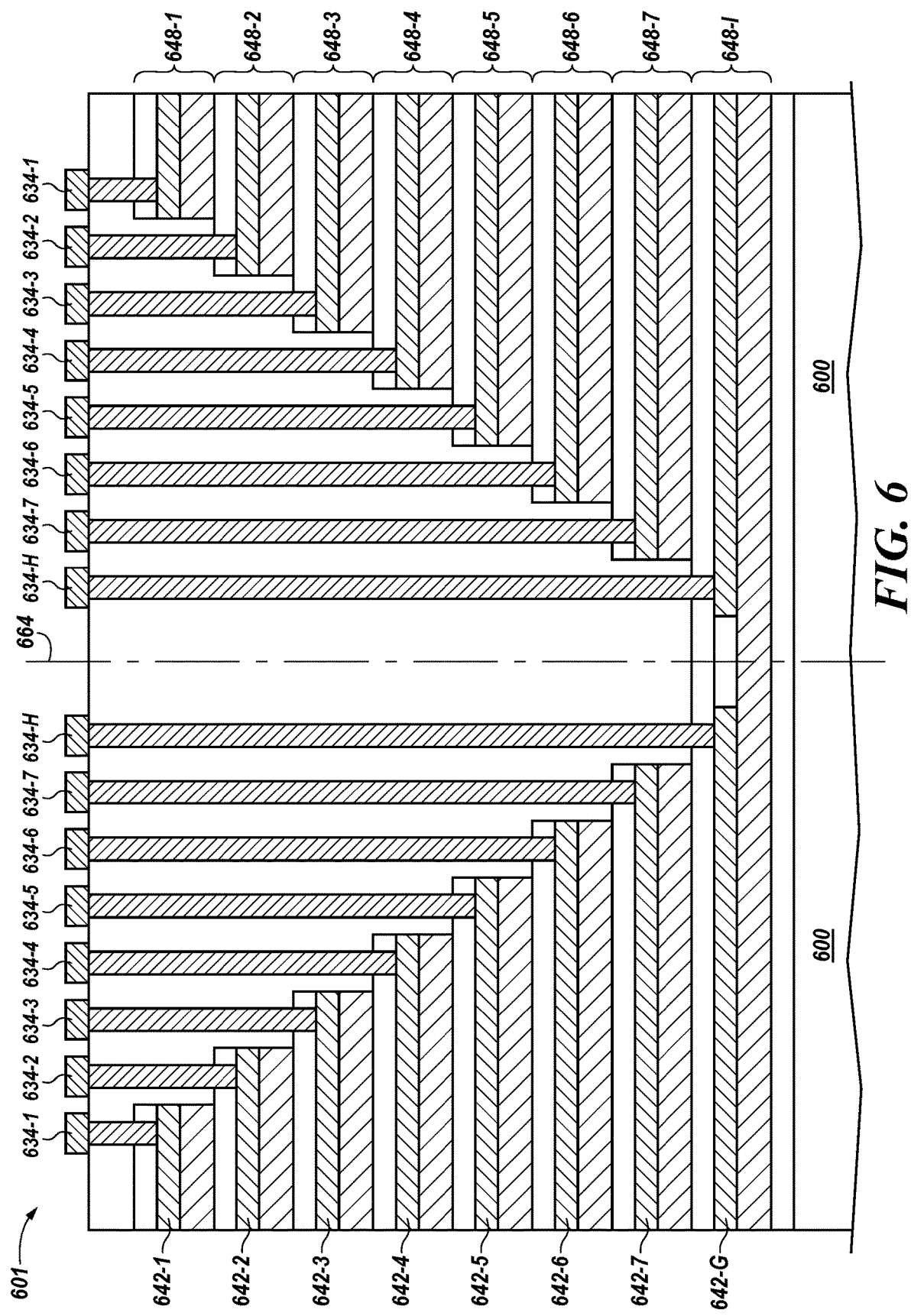
FIG. 6 is a cross-sectional view illustrating a conductive line and staircase contact for a vertical memory array in accordance with one or more embodiments of the present disclosure.
Figure 7A:
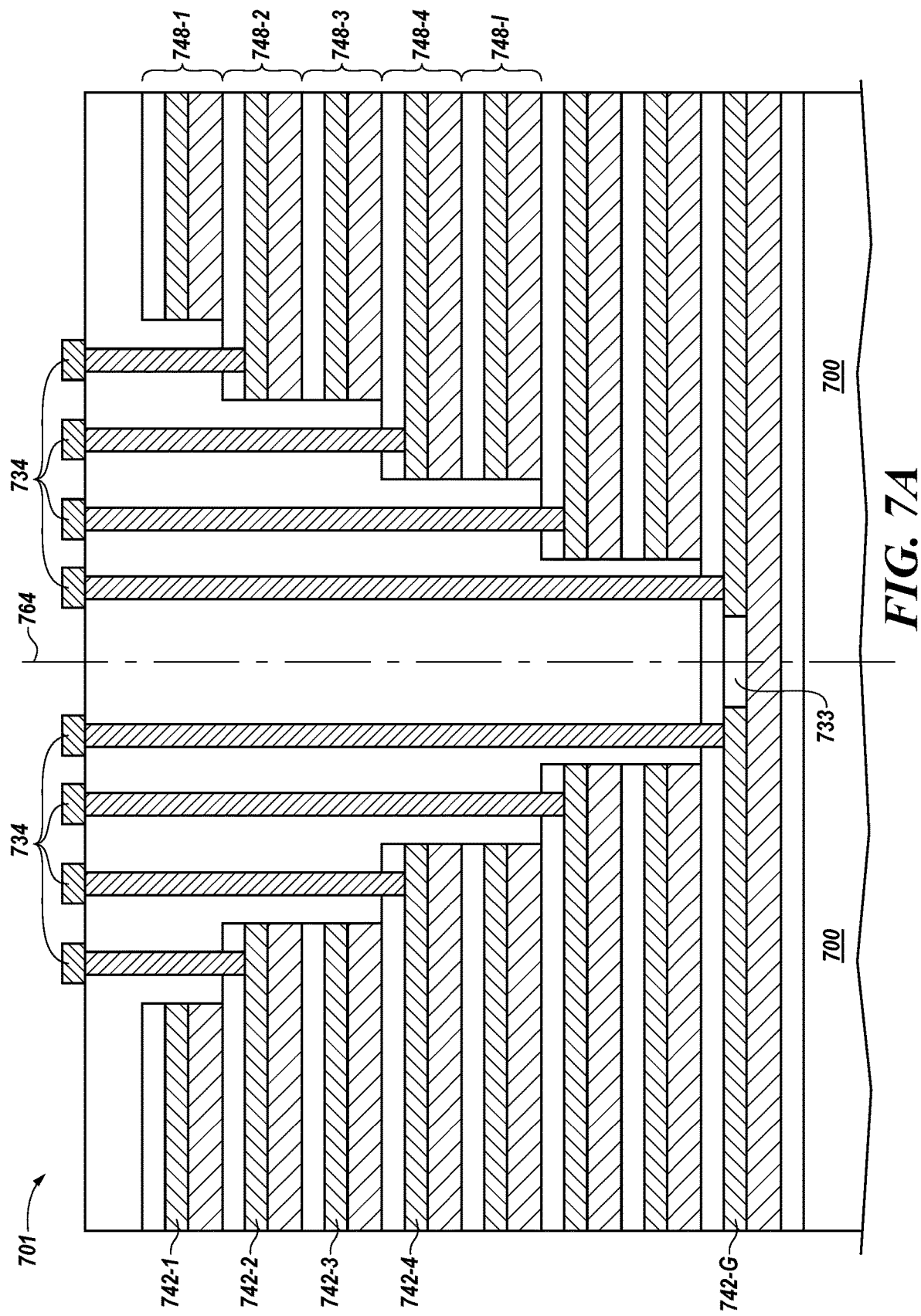
FIG. 7A is a cross-sectional view along a first end of a sense amplifier illustrating a digit line and staircase contact for a vertical memory array in accordance with one or more embodiments of the present disclosure.
Figure 7B:
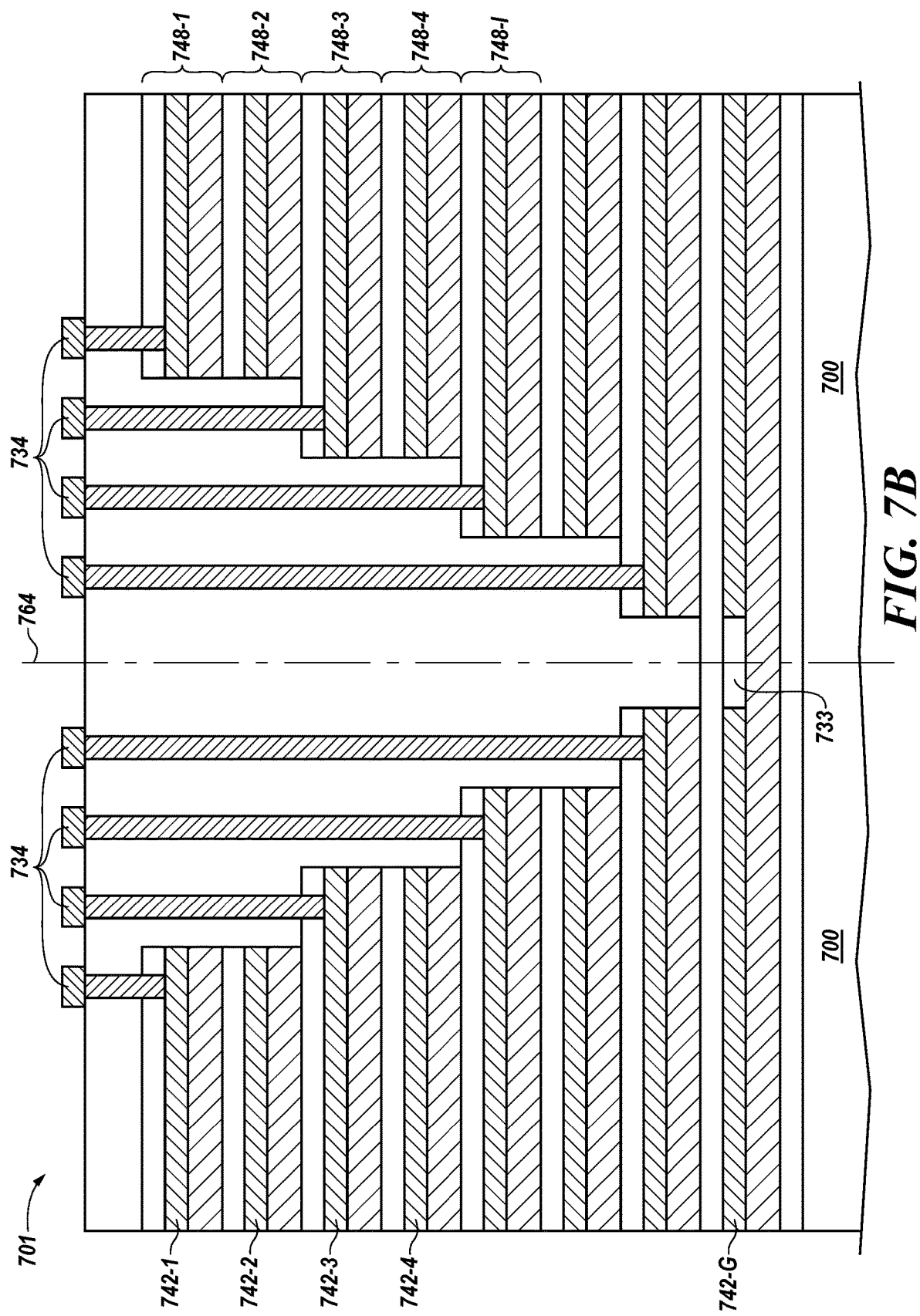
FIG. 7B is a cross-sectional view along a second end of a sense amplifier illustrating a conductive line and staircase contact for a vertical memory array in accordance with one or more embodiments of the present disclosure.

As shown in more detail in FIG. 6, FIG. 7A, and FIG. 7B, a method of forming various levels of an array region may be repeated in a number of iterations to form multi-level conductive line contacts at more than two levels. For example, a method may be repeated in a number of iterations such as to form eight levels of conductive line contacts, as illustrated in FIG. 6, FIG. 7A, and FIG. 7B.

FIG. 5Q illustrates an overhead view of another stage of a method of forming multi-direction conductive lines and staircase contacts for semiconductor devices in accordance with one or more embodiments of the present disclosure. Line D-D' runs along the second portions 542-1, ..., 542-4 of conductive lines 507-1, ..., 507-4. Through all stages of methods described in accordance with the present disclosure, the lowermost semiconductor layer 532-0 and the lowermost first dielectric layer 530 remain intact in the sense amplifier regions 537. Region 599 may be selectively etched to remove a portion of underlying conductive material 576.

FIG. 5R is a cross-section along line D of FIG. 5Q, illustrating two adjacent array regions 540-1 and 540-2.

Each array includes its own vertical stack 501 of horizontally oriented conductive lines and layers of the first dielectric material 530, the semiconductor material 532, and the second dielectric material 533. As illustrated in FIG. 5R, a group of layers 548-0 near the bottom of the vertical stacks 501 may remain unaltered (no material removed). For example, in FIG. 5R, a group of layers 548-0 containing a layer of a first dielectric material 530, a layer of a second dielectric material 533-0, a layer of a semiconductor material 532-0, and a second layer of first dielectric material 530-0 remain at the bottom of the vertical stack 501 without any portions of any of the layers removed.

FIG. 5S illustrates an overhead view of another stage of a method of forming multi-direction conductive lines and staircase contacts for semiconductor devices in accordance with one or more embodiments of the present disclosure. As shown in FIG. 5S, a mask layer deposited over region 590 may be removed to allow access to the final conductive line of the staircase structure. The bottom metal layer corresponding to the final conductive line located in the region 590 (e.g., the sense amplifier region) can be removed in order to electrically separate the bottom metal layer from neighboring array regions.

FIG. 6 is a cross-sectional view along line D-D' of FIG. 5S illustrating another example stage of a method of forming conductive lines and staircase contacts for semiconductor devices in accordance with one or more embodiments of the present disclosure. In some embodiments, a fourth dielectric material 637 may be deposited into the vertical opening 680. The fourth dielectric material 637 may be similar in composition to the first dielectric material 630. For example, in some embodiments, the first dielectric material 630 and the fourth dielectric material 680 may each include an oxide material.

The portions of conductive lines 642-1, . . . , 642-G illustrated in FIG. 6 may correspond to the second portion of the digit lines 442-1, . . . , 442-G illustrated in FIG. 4B. As shown in FIG. 4A and in FIG. 6, the number of sense amplifiers may each be coupled to a conductive line. Each level of the vertical stack 601 may include conductive lines 642-1, . . . , 642-G coupled to a sense amplifier via interconnections 634-1, . . . , 634-H (e.g., conductive line contacts) on either side of the reference line 664. In some embodiments, each conductive line portion 642-1, . . . , 642-G in the vertical stack 601 may be of a length greater than that of the conductive line 642-1, . . . , 642-G above it in the vertical stack 601. For example, since conductive line 642-1 is the top digit line in the stack, it may be of a length less than the length of any other conductive lines 642-2, . . . , 642-G below it in the vertical stack 601.

As illustrated in FIG. 6, each interconnection 634-1, . . . , 634-H to a sense amplifier may be coupled to a conductive line portion 642 at or near an end of that conductive line portion 642 (i.e., near the end of a given level 648). In some embodiments, the number of interconnections 634-H may be equal to twice the number of levels 648-I. For example, an eight-level vertical stack 601 may be coupled to sixteen interconnections 634-1, . . . , 634-16 to sense amplifiers (e.g., in a folded digit line architecture).

In some embodiments, one or more layers of the second dielectric material 633 with conductive lines portions 642-1, . . . , 642-G formed therein may retain their original portions of the second dielectric material and conductive line lengths. For example, in FIG. 6, the bottom level 648-0 of layers includes a layer of the second dielectric material with a conductive line portion 642-G formed therein. In this example embodiment, the conductive line portion 642-G retains its original length. The layer of the second dielectric material with a conductive line portion 642-G formed therein retains a portion of the second dielectric material between the conductive line portions in this layer. The portion of the second dielectric material may be centered around the reference line 664 and allows for the two conductive lines to each receive an interconnection 634-H to a sense amplifier.

FIG. 7A is a cross sectional view of an alternative embodiment along line D-D' of FIG. 5S illustrating a conductive line and staircase contact for a semiconductor device in accordance with one or more embodiments of the present disclosure. In some embodiments, rather than performing a removal process on each level 748-0, . . . , 748-I of the vertical stack 701 as described in connection with FIG. 5P and FIG. 6, interconnections to sense amplifiers 734-1, . . . , 734-H may be coupled to only the conductive line portions 742 of the even-numbered levels 748-0, 748-2, 748-4, . . . , 748-I on a first side of the stack 701 as illustrated in FIG. 7A and to only the conductive lines of the odd-numbered levels 748-1, 748-3, . . . , 748-I on a second side of the stack as illustrated in FIG. 7B in a different sense amplifier area.

In accordance with embodiments of the present disclosure, one example method of an embodiment of forming arrays of vertically stacked memory cells may include depositing a number of layers, the layers including a first dielectric material layer, a semiconductor material layer, and a second dielectric material layer having one or more horizontal conductive lines formed therein, in repeating iterations to form a stack.

The method for forming arrays may also include a removal process in repeating vertical iterations. As illustrated in FIGS. 5A-5S, FIG. 7A, and FIG. 7B, the removal process may include selectively removing a portion of each layer of a first group of layers of the number of layers by removing a portion of each layer of the first group of layers between a reference line and a first lateral distance from the reference line. The removal process may further include selectively removing a portion of each layer of a second group of layers of the number of layers by removing the portion of each layer of the second group of layers between the reference line and a second lateral distance from the reference line. A second portion of each layer of the first group of layers may then be selectively removed by removing the second portion of each layer of the first group of layers between the reference line and a third distance back from the reference line. The third distance may be greater than the second distance.

The removal may be performed on each side of the reference line, such that a portion of each layer of a first group of layers of the number of layers are removed by removing a portion of each layer of the first group of layers between the reference line and a first lateral distance to the left of the reference line as well as a portion of each layer of the first group of layers between the reference line and a first lateral distance to the right of the reference line.

As illustrated in FIG. 7A, for each iteration of the removal process, there may be a third group of layers between the first group of layers and the second group of layers. The third group of layers may also have a first portion which is selectively removed. The first portion of the third group of layers may extend between the reference line and the first horizontal distance from the reference line. The third group of layers may also have a second portion which is selectively removed by removing the second portion of each layer of the first group of layers between the reference line and the third distance back from the reference line. Thus, in embodiments such as the one illustrated in FIG. 7A and FIG. 7B, each level of the vertical stack 701 may include two groups of layers, where each group of layers includes three or more layers of material. For example, a level of the vertical stack 701 may include a first layer of a first dielectric material, a first digit line layer, a first layer of semiconductor material, a second layer of a first dielectric material, a second digit line layer, and a second layer of semiconductor material.

As illustrated in FIG. 7A and FIG. 7B, a vertical stack 701 may include an even number of levels. The number of interconnections coupled to the conductive lines may be equal to half of the number of levels.

As illustrated in FIG. 7A, the number of levels may include a first level comprised of a single group of layers. In other words, the first level may include three layers of material [e.g., a layer of a first dielectric material, a conductive line layer (including a second dielectric material and a conductive material), and a layer of a semiconductor material]. The first level may be positioned on the top of the vertical stack 701. As shown in FIG. 7A, the first level may not be coupled to an interconnection.

As shown in FIG. 7A, the vertical stack 701 may include a bottom group of layers. The bottom group of layers may include a layer of the first dielectric material 730, a layer of the second dielectric material 733 with a digit line formed therein, and a layer of a semiconductor material 732. The bottom group of layers may further include an additional layer of the first dielectric material 730. The bottom group of layers may be vertically adjacent to the substrate 700. In some embodiments, the bottom group of layers may include a layer of a second dielectric material 733 with a conductive line formed therein, and the conductive line may be coupled to an interconnection 734 on either side of the reference line.

In some embodiments, each level between the bottom group of layers and the first level may include two groups of layers, where each of the two groups of layers includes at least two digit lines. In some embodiments, an interconnection 734 may be coupled to one conductive line of each level. The conductive line of each level coupled to the interconnection 734 may be the conductive line of that level which is closest to the top of the vertical stack 701. In some embodiments, two interconnections 734 may be coupled to each level, wherein one interconnection is coupled to a conductive line on either side of the reference line. The interconnections 734 of each level may be equidistant from the reference line.

FIG. 7B is a cross-sectional view of an alternative embodiment along line D of FIG. 5S illustrating a conductive line and staircase contact for a semiconductor device in accordance with one or more embodiments of the present disclosure. As illustrated in FIG. 7B, the vertical stack 701 may include a bottom group of layers. The bottom group of layers may include a layer of the first dielectric material, a layer of the second dielectric material with a digit line formed therein, and a layer of a semiconductor material. The bottom group of layers may further include an additional layer of the first dielectric material. The bottom group of layers may be vertically adjacent to the substrate 700. In some embodiments, the bottom group of layers may include a layer of a second dielectric material with a digit line portion 742-G formed therein. As illustrated in FIG. 7B, the conductive line may not be coupled to any interconnection to a sense amplifier.

As illustrated in FIG. 7B, each level may be coupled to an interconnection to a sense amplifier through a conductive line on either side of the central line 764. In other words, each level may include three or more layers of material (e.g., a layer of a first dielectric material, a digit line layer, and a layer of a semiconductor material). In this embodiment, each level, with the exception of the bottom level, may include two conductive lines. The arrangements illustrated in FIGS. 7A and 7B can be used in alternating rows of cell arrays, as will be discussed in more detail below.

Figure 8:
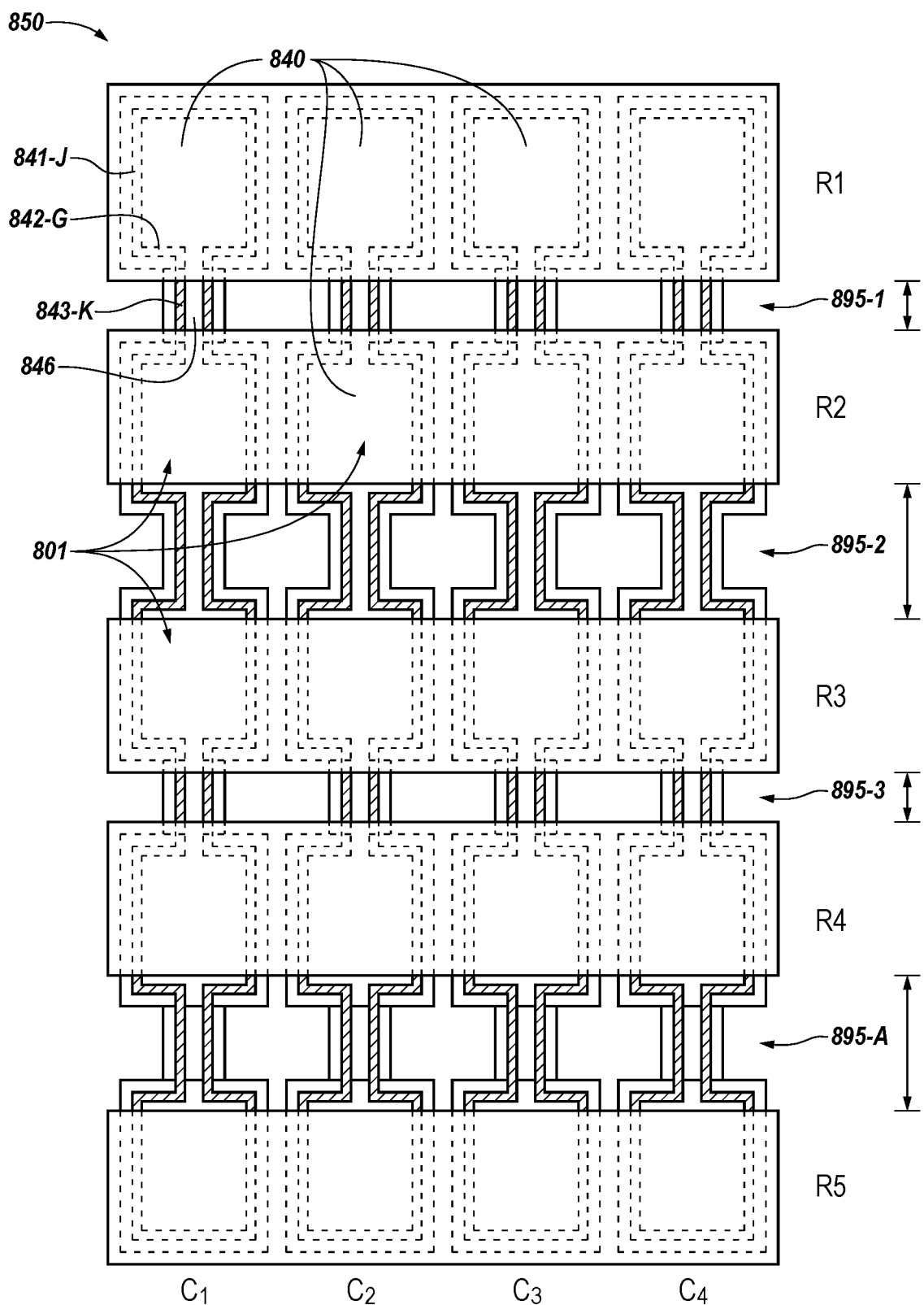
FIG. 8 is an overhead view of an array of sense amplifiers and conductive lines in accordance with one or more embodiments of the present disclosure.

FIG. 8 illustrates an overhead view of a memory device in accordance with one or more embodiments of the present disclosure. As shown in FIG. 8, a memory device may include an array 850 of memory cell regions 840. Each array region 840 may be joined to an adjacent array region in the same column ($C_1, \ldots, C_N$) of the array 850 through a bridge 846. Conductive lines may be formed around the perimeters of each column ($C_1, \ldots, C_N$) of the array 850.

Each conductive line may include a first number of portions 841 extending in a first horizontal direction and a second number of portions 842 extending in a second horizontal direction at an angle to the first horizontal direction. Each conductive line may further include a third number of portions 843 extending in a third horizontal direction at an angle to the second horizontal direction. In some embodiments, the third horizontal direction may be aligned with the first horizontal direction. The second horizontal direction may be perpendicular to the first horizontal direction. Each third portion of a conductive line may be aligned with an edge of a bridge device of the number of bridge devices.

The odd-numbered groups of body array regions 840 (i.e., $R_1, R_3, R_5, \ldots$) may each include a first edge where the vertical stacks are configured in accordance with FIG. 7B and a second edge where the vertical stacks is configured in accordance with FIG. 7A. The even-numbered groups of array regions (i.e., $R_2, R_4, \ldots$) may include a first edge where the vertical stack is configured in accordance with FIG. 7A and a second edge where the vertical stack 801-1, ..., 801-N is configured in accordance with FIG. 7B.

In some embodiments, a mask (e.g., a photoresist layer) may be deposited over each region ($R_1, \ldots, R_N$) of the memory array 850. Regions 895-1, 895-3, ..., 895-A leave the bridge areas and some areas of the array regions adjacent to the bridges in the even groups exposed so that material can be removed and filled to form the structures of FIGS. 7A and 7B. Although FIG. 8 illustrates an array comprising four columns of five array cells, embodiments of the present disclosure are not so limited.

Figure 9:
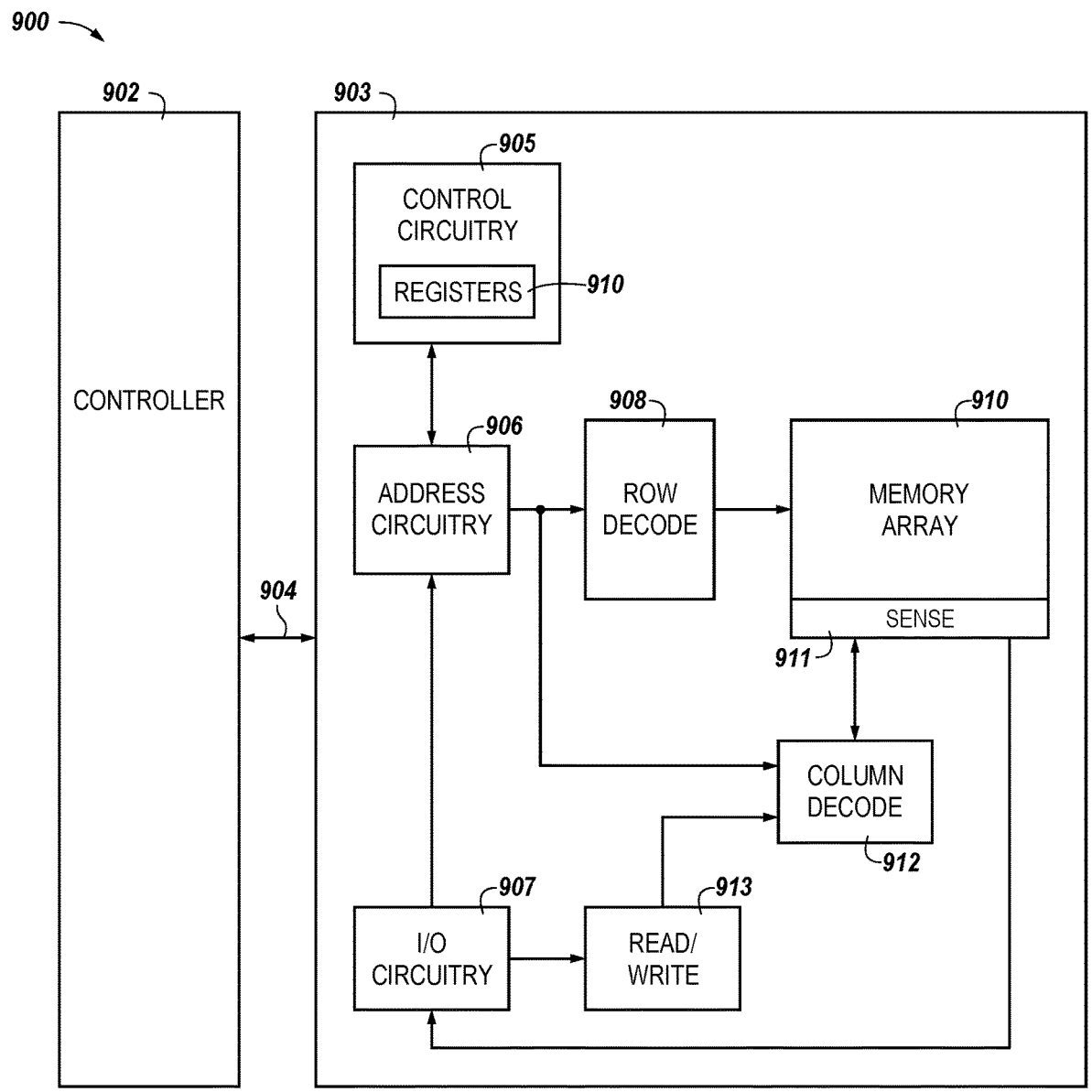
FIG. 9 is a block diagram of an apparatus in the form of a computing system including a memory device in accordance with a number of embodiments of the present disclosure.

Through implementation of the embodiments of the present disclosure space can be reduced in the interconnection area from conductive lines to sense amplifiers, among other benefits. FIG. 9 below provides an example of where such benefits may be utilized.

FIG. 9 is a block diagram of an apparatus in the form of a computing system 900 including a memory device 903 in accordance with a number of embodiments of the present disclosure. As used herein, a memory device 903, a memory array 910, and/or a host 902, for example, might also be separately considered an "apparatus." According to embodiments, the memory device 902 may include at least one memory array 910 with a memory cell formed having a conductive line and staircase contact, according to the embodiments described herein. A memory array 910 may be, for example, array 850 described previously. The memory device 902 may be, for example, a portion of a sub cell array 101-2 shown in FIG. 1 as a vertically oriented stack of memory cells in an array.

In this example, system 900 includes a host 902 coupled to memory device 903 via an interface 904. The computing system 900 can be a personal laptop computer, a desktop computer, a digital camera, a mobile telephone, a memory card reader, or an Internet-of-Things (IoT) enabled device, among various other types of systems. Host 902 can include a number of processing resources (e.g., one or more processors, microprocessors, or some other type of controlling circuitry) capable of accessing memory 903. The system 900 can include separate integrated circuits, or both the host 902 and the memory device 903 can be on the same integrated circuit. For example, the host 902 may be a system controller of a memory system comprising multiple memory devices 903, with the system controller 905 providing access to the respective memory devices 903 by another processing resource such as a central processing unit (CPU).

In the example shown in FIG. 9, the host 902 is responsible for executing an operating system (OS) and/or various applications (e.g., processes) that can be loaded thereto (e.g., from memory device 903 via controller 905). The OS and/or various applications can be loaded from the memory device 903 by providing access commands from the host 902 to the memory device 903 to access the data comprising the OS and/or the various applications. The host 902 can also access data utilized by the OS and/or various applications by providing access commands to the memory device 903 to retrieve said data utilized in the execution of the OS and/or the various applications.

For clarity, the system 900 has been simplified to focus on features with particular relevance to the present disclosure. The memory array 910 can be a DRAM array comprising at least one memory cell having multi-direction conductive lines and staircase contacts formed according to the techniques described herein. For example, the memory array 910 can be an unshielded DL 4F2 array such as a 3D-DRAM memory array. The array 910 can include memory cells arranged in rows coupled by word lines (which may be referred to herein as access lines or select lines) and columns coupled by conductive lines (which may be referred to herein as digit lines, sense lines, or data lines). Although a single array 910 is shown in FIG. 1, embodiments are not so limited. For instance, memory device 903 may include a number of arrays 910 (e.g., a number of banks of DRAM cells).

The memory device 903 includes address circuitry 906 to latch address signals provided over an interface 904. The interface can include, for example, a physical interface employing a suitable protocol (e.g., a data bus, an address bus, and a command bus, or a combined data/address/command bus). Such protocol may be custom or proprietary, or the interface 904 may employ a standardized protocol, such as Peripheral Component Interconnect Express (PCIe), Gen-Z, CCIX, or the like. Address signals are received and decoded by a row decoder 908 and a column decoder 912 to access the memory array 910. Data can be read from memory array 910 by sensing voltage and/or current changes on the sense lines using sensing circuitry 911. The sensing circuitry 911 can comprise, for example, sense amplifiers that can read and latch a page (e.g., row) of data from the memory array 910. The I/O circuitry 907 can be used for bi-directional data communication with the host 902 over the interface 904. The read/write circuitry 913 is used to write data to the memory array 910 or read data from the memory array 910. As an example, the circuitry 913 can include various drivers, latch circuitry, etc.

Control circuitry 905 decodes signals provided by the host 902. The signals can be commands provided by the host 902. These signals can include chip enable signals, write enable signals, and address latch signals that are used to control operations performed on the memory array 910, including data read operations, data write operations, and data erase operations. In various embodiments, the control circuitry 905 is responsible for executing instructions from the host 902. The control circuitry 905 can include a state machine, a sequencer, and/or some other type of control circuitry, which may be implemented in the form of hardware, firmware, or software, or any combination of the three. In some examples, the host 902 can be a controller external to the memory device 903. For example, the host 902 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

As used herein, the term "secondary portion" may be used synonymously with the term "second portion", meaning a portion extending in a different direction than a "first portion" or "primary portion". For example, a first portion may extend in a first direction, and a number of secondary portions may extend in a second direction perpendicular to the first direction.

The terms "first portion" and "second portion" may be used herein to denote two portions of a single element. For example, a "first portion" of a conductive line and a "second portion" of a conductive line may denote two portions of a single conductive line. It is not intended that the portions referred to as the "first" and/or "second" portions have some unique meaning. It is intended only that one of the "portions" extends in a different direction than another one of the "portions."

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A memory device, comprising:
   an array of vertically stacked memory cells, the array comprising:
   a vertical stack of horizontally oriented conductive lines, a plurality of the horizontally oriented conductive lines comprising:
   a first portion extending in a first horizontal direction; and
   a second portion extending in a second horizontal direction at an angle to the first horizontal direction, wherein the second portion of each of the plurality of the horizontally oriented conductive lines is of a length greater than a length of the second portion of a horizontally oriented conductive line on a higher vertical level of the vertical stack; and
   interconnections connected to and extending in the first horizontal direction from a sense amplifier, wherein the second portion of each of the plurality of the horizontally oriented conductive lines is coupled to the sense amplifier via a respective interconnection of the interconnections to reduce an amount of space occupied by the interconnections in the first horizontal direction.

2. The memory device of claim 1, wherein the array of vertically stacked memory cells further comprises a number of horizontally oriented access devices, wherein each horizontally oriented access device electrically couples a respective interconnection of the interconnections to the sense amplifier.

3. The memory device of claim 2, further comprising a vertical body contact formed in direct electrical contact with one or more of the horizontally oriented access devices.

4. The memory device of claim 1, wherein each conductive line further comprises a third portion extending in a third horizontal direction at an angle to the second horizontal direction.

5. The memory device of claim 1, wherein the memory device is a three-dimensional (3D) dynamic random access memory device.

6. The memory device of claim 1, wherein the array of vertically stacked memory cells is electrically coupled in an open digit line architecture.

7. The memory device of claim 1, wherein the array of vertically stacked memory cells is electrically coupled in a folded digit line architecture.

* * * * *